(12) United States Patent
Pei et al.

(10) Patent No.: US 11,211,341 B2
(45) Date of Patent: Dec. 28, 2021

(54) PACKAGE STRUCTURE AND METHOD OF FABRCATING THE SAME

(71) Applicant: Taiwan Semiconductor Manufacturing Co., Ltd., Hsinchu (TW)

(72) Inventors: Hao-Jan Pei, Hsinchu (TW); Ching-Hua Hsieh, Hsinchu (TW); Hsiu-Jen Lin, Hsinchu County (TW); Wei-Yu Chen, Taipei (TW); Chia-Shen Cheng, Hsinchu County (TW); Chih-Chiang Tsao, Taoyuan (TW); Jen-Jui Yu, Taipei (TW); Cheng-Shiuan Wong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/719,984

(22) Filed: Dec. 19, 2019

(65) Prior Publication Data
US 2021/0193589 A1 Jun. 24, 2021

(51) Int. Cl.
| | | |
|---|---|---|
| H01L 23/00 | (2006.01) | |
| H01L 23/31 | (2006.01) | |
| H01L 21/56 | (2006.01) | |
| H01L 23/498 | (2006.01) | |

(52) U.S. Cl.
CPC .......... H01L 23/562 (2013.01); H01L 21/568 (2013.01); H01L 23/3128 (2013.01); H01L 23/3135 (2013.01); H01L 23/49822 (2013.01)

(58) Field of Classification Search
None
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2008/0089048 A1* | 4/2008 | Yamano | H01L 23/5389 361/812 |
| 2012/0280404 A1* | 11/2012 | Kwon | H01L 21/565 257/777 |

(Continued)

*Primary Examiner* — Jay C Chang
(74) *Attorney, Agent, or Firm* — JCIPRNET

(57) ABSTRACT

Provided is a package structure, including a die, a plurality of through vias, an encapsulant, a plurality of first connectors, a warpage control material and a protection material. The plurality of through vias are disposed around the die. The encapsulant laterally encapsulate the die and the plurality of through vias. The plurality of first connectors are electrically connected to the plurality of through vias. The warpage control material is disposed over a first surface of the die. The protection material is disposed over the encapsulant, around the plurality of first connectors and the warpage control material.

20 Claims, 43 Drawing Sheets

(56) References Cited

U.S. PATENT DOCUMENTS

| | | | |
|---|---|---|---|
| 2014/0252646 A1* | 9/2014 | Hung | H01L 21/486 257/774 |
| 2016/0126226 A1* | 5/2016 | Pei | H01L 24/97 257/773 |
| 2017/0047296 A1* | 2/2017 | Watanabe | H01L 23/31 |
| 2017/0207205 A1* | 7/2017 | Kim | H01L 21/565 |
| 2018/0044169 A1* | 2/2018 | Hatcher, Jr. | H01L 24/24 |

* cited by examiner

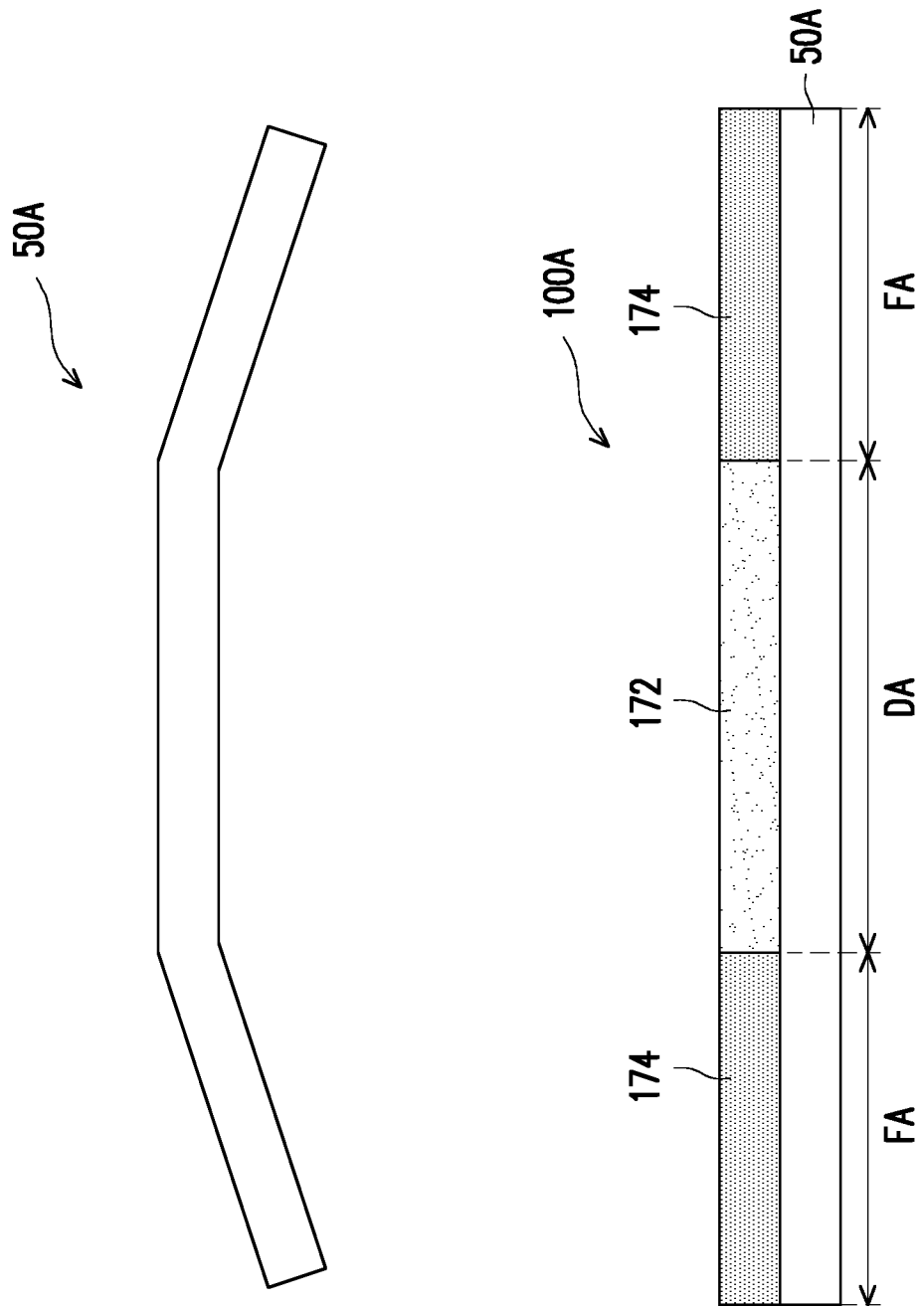

PACKAGE STRUCTURE AND METHOD OF FABRCATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. And the formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic cross-sectional view illustrating package structures according to some embodiments of the disclosure.

DETAILED DESCRIPTION

Figure 1A:
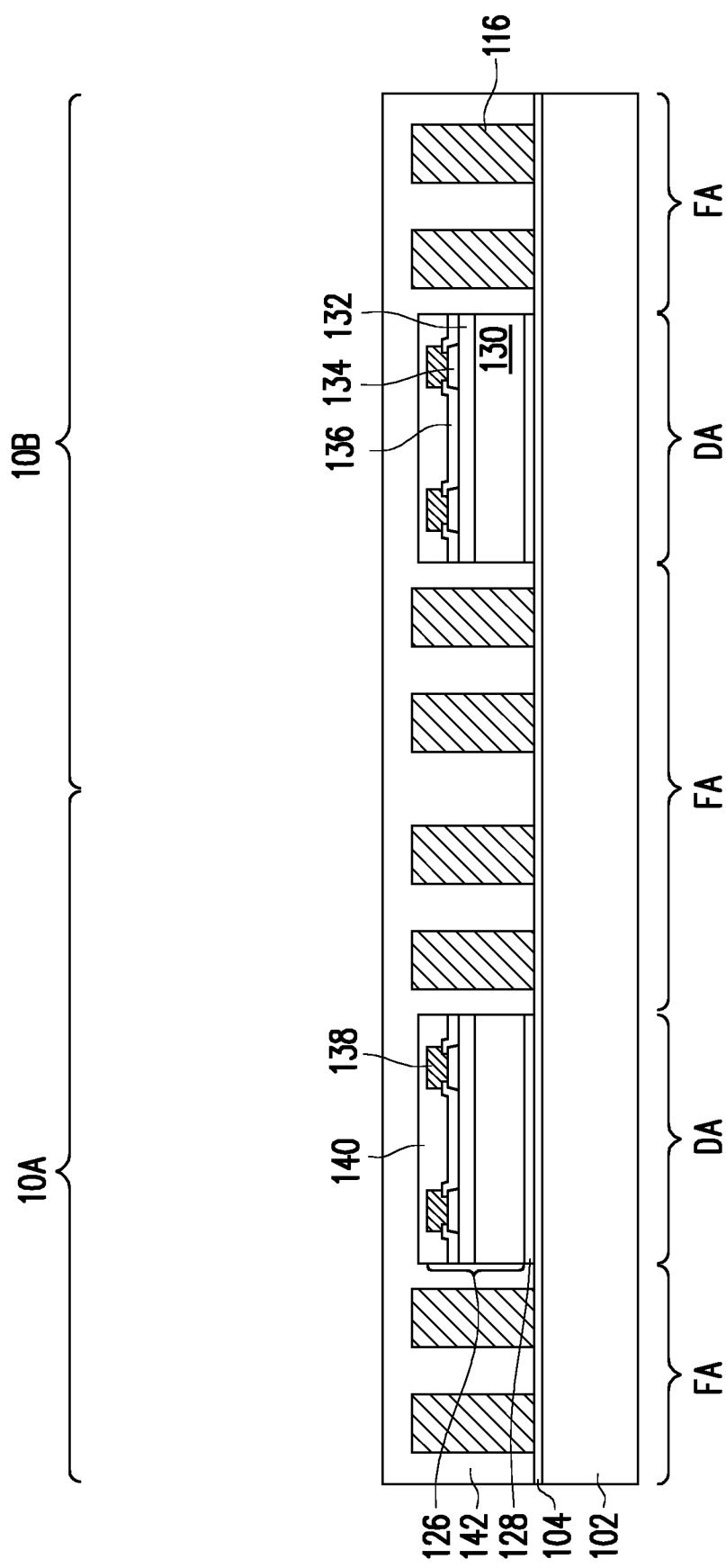
FIGS. 1A through 1J are schematic cross-sectional views illustrating a method of manufacturing a device package according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A through 1J illustrate cross-sectional views of intermediate steps during a process for forming a device package 100, in accordance with some embodiments. FIGS. 4A through 4B illustrate cross-sectional views of intermediate steps during a process for forming a device package 101, in accordance with other some embodiments. A first package region 10A and a second package region 10B are illustrated, and a package structure 100A, 101A, 103, 105, 107 or 109 (see FIGS. 2, 3B, 5B and 6) is formed in each of the first package region 10A and the second package region 10B. The packages 100A, 101A, 103, 105, 107 and 109 may also be referred to as integrated fan-out (InFO) packages.

Referring to FIG. 1A, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 7A:
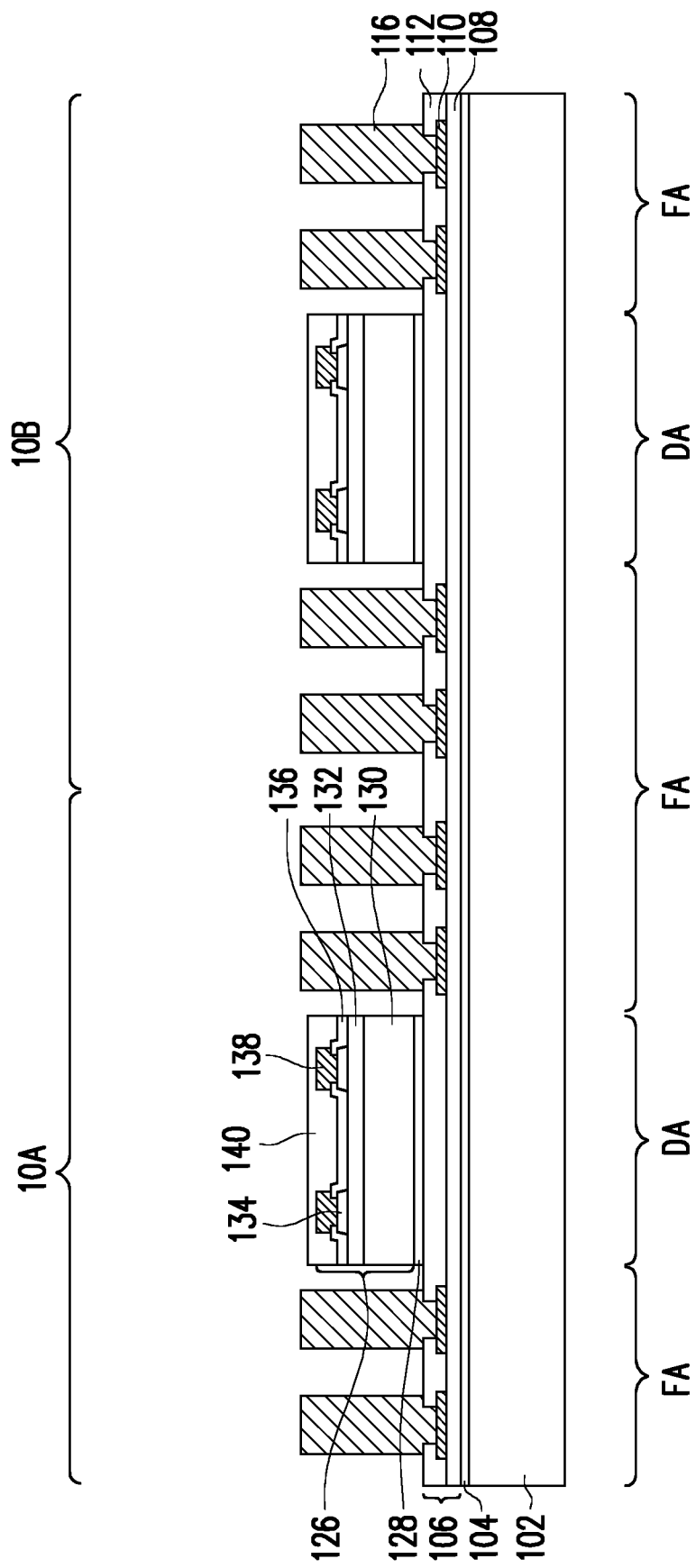
FIGS. 7A through 7D are schematic cross-sectional views illustrating a method of manufacturing a device package according to some embodiments of the disclosure.
Figure 9A:
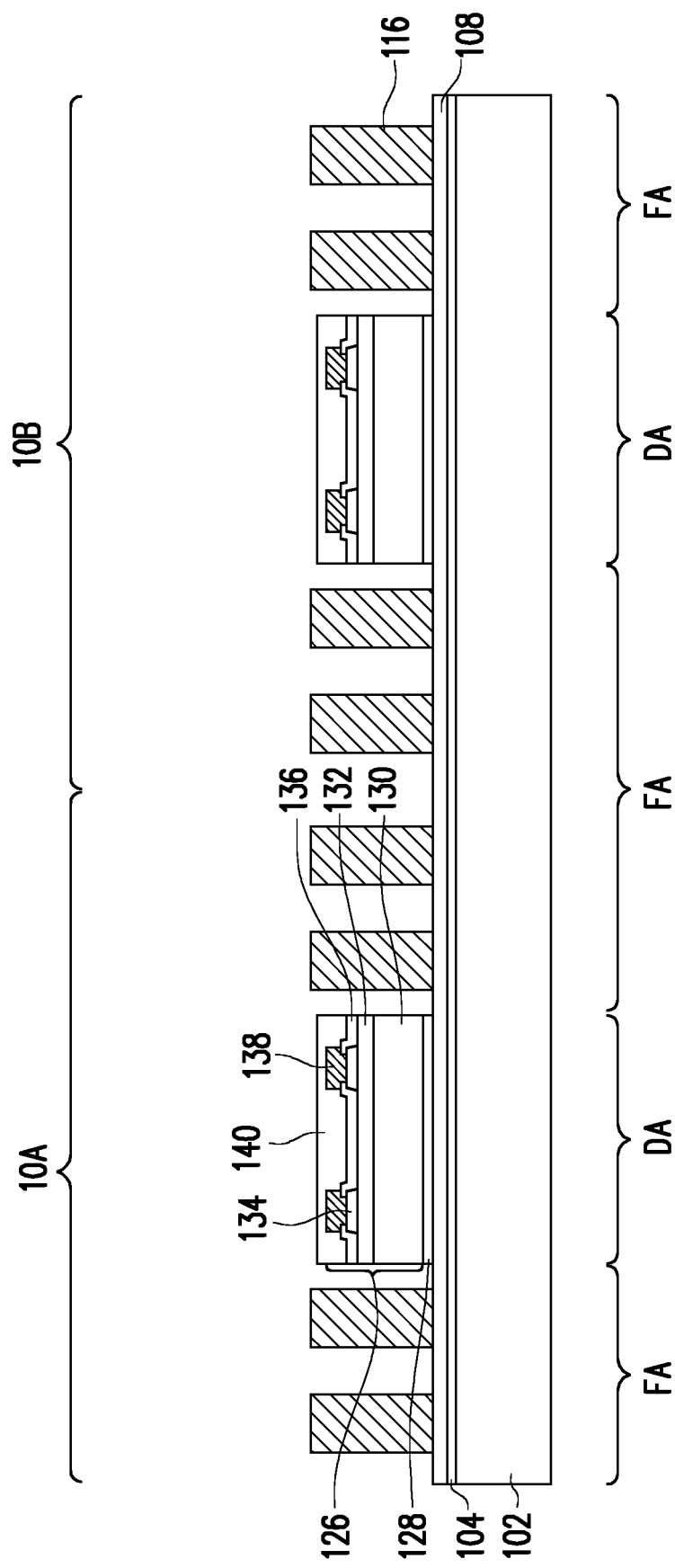
FIGS. 9A through 9D are schematic cross-sectional views illustrating a method of manufacturing a device package according to some embodiments of the disclosure.

Referring to FIG. 1A, conductive pillars 116 are formed on the release layer 104 in fan-out areas FA. In some embodiments, before the conductive pillars 116 are formed, a back-side redistribution structure 106 may be formed on the release layer 104 as shown in FIG. 7A. The back-side redistribution structure 104 is optional. In some embodiments, only a bottom dielectric layer 108 is formed on the release layer 104 as shown in FIG. 9A. The back-side redistribution structure 106 is omitted in this embodiment as shown in FIG. 1A.

As an example to form the conductive pillars 116, a seed layer is formed over the release layer 104. In some embodiments, the seed layer is a metal layer, which may be a single layer or a composite layer comprising a plurality of sub-layers formed of different materials. For example, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pillars 116.

Referring to FIG. 1A, integrated circuit dies 126 are adhered to the release layer 104 in die areas DA by an adhesive 128. The integrated circuit dies 126 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 126 may be different sizes (e.g., different heights and/or surface areas), and in other embodiments, the integrated circuit dies 126 may be the same size (e.g., same heights and/or surface areas).

Before being adhered to the release layer 104, the integrated circuit dies 126 may be processed according to applicable manufacturing processes to form integrated circuits in the integrated circuit dies 126. For example, the integrated circuit dies 126 each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The integrated circuit dies 126 further comprise pads 134, such as aluminum pads, to which external connections are made. The pads 134 are on what may be referred to as respective active sides of the integrated circuit dies 126. Passivation films 136 are on the integrated circuit dies 126 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the respective pads 134. The die connectors 138 may be formed by, for example, plating, or the like. The die connectors 138 electrically couple the respective integrated circuits of the integrated circuit dies 126.

A dielectric material 140 is on the active sides of the integrated circuit dies 126, such as on the passivation films 136 and the die connectors 138. The dielectric material 140 laterally encapsulates the die connectors 138, and the dielectric material 140 is laterally coterminous with the respective integrated circuit dies 126. The dielectric material 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-side surfaces of the integrated circuit dies 126 and adheres the integrated circuit dies 126 to the release layer 104. In some embodiments, the first surfaces may be referred to as first surfaces or non-active surfaces. The back-side surfaces are opposite to front-side surfaces, the first surfaces are opposite to second surfaces, and the non-active surfaces are opposite to active side surfaces.

The adhesive 128 may be applied to the back-side surfaces of the integrated circuit dies 126 before singulating to separate the integrated circuit dies 126. The adhesive 128 may be any suitable adhesive, epoxy, die attach film (DAF), or the like. In some embodiments, the adhesive 128 may be similar to the material of a warpage control material 172. The adhesive 128 may include a base material (such as epoxy). The adhesive 128 may further include a plurality of fillers in the base material. The average filler size of the filler may be, for example, less than 10 µm. In some embodiments, the content of the fillers in the adhesive 128 is greater than 50 wt %, such as 50 wt % to 80 wt % or more, based on the total weight of the adhesive 128. The CTE of the adhesive 128 is greater than the CTE of the integrated circuit dies 126. For example, the CTE of the adhesive 128 is less than 50 ppm/° C. in a temperature range. The Young's Modulus of adhesive 128 is less than the Young's Modulus of the integrated circuit dies 126.

Although one integrated circuit die 126 is illustrated as being adhered in each of the first package region 10A and the second package region 10B, it should be appreciated that more integrated circuit dies 126 may be adhered in each package region. For example, multiple integrated circuit dies 126 may be adhered in each region. Further, the integrated circuit dies 126 may vary in size. In some embodiments, the integrated circuit die 126 may be dies with a large footprint, such as system-on-chip (SoC) devices.

Referring to FIG. 1A, an encapsulant 142 is formed on the various components. After formation, the encapsulant 142 laterally encapsulates the conductive pillars 116 and integrated circuit dies 126. In some embodiments, the encapsulant 142 includes a molding compound, a molding underfill, a resin such as epoxy, a combination thereof, or the like. In some other embodiments, the encapsulant 142 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 142 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. The cross-section shape of the filler may be circle, oval, or any other shape. In some embodiments, the fillers include solid fillers, but the disclosure is not limited thereto. In some embodiments, a small portion of the fillers may be hollow fillers.

The filler size and filler content of the encapsulant 142 are controlled in a suitable range, and suitable base material and additives are selected to form the encapsulant 142, such that the encapsulant 142 has a good property to provide the encapsulation of the integrated circuit dies 126. For example, the average filler size of the filler may be less than 30 µm. In some embodiments, the content of the fillers in the encapsulant 142 is greater than 70 wt %, such as 70 wt % to 90 wt % or more, based on the total weight of the encapsulant 142.

In some embodiments, the CTE of the encapsulant 142 is greater than the CTE of the integrated circuit dies 126 and the adhesive 128. The thermal expansion coefficient (CTE) of the encapsulant 142 is less than 20 ppm/° C. in a temperature range under glass transition temperature (Tg), and 40 ppm/° C. to 80 ppm/° C. in a temperature range higher than Tg, for example. The viscosity of the encapsulant 142 is greater than the viscosity of the adhesive 128. The viscosity of the encapsulant 142 is less than 50 Pa·s at room temperature. In some embodiments, the Young's Modulus of the encapsulant 142 is greater than the Young's Modulus of the adhesive 128, and less than the Young's Modulus of the integrated circuit dies 126. The Young's Modulus of the encapsulant 142 ranges from 10 Gpa to 20 Gpa at room temperature.

The encapsulant 142 may be applied by compression molding, transfer molding, spin-coating, lamination, deposition, or similar processes, and may be formed over the carrier substrate 102 such that the conductive pillars 116 and/or the integrated circuit dies 126 are buried or covered. The encapsulant 142 is then cured. The conductive pillars 116 penetrate the encapsulant 142, and the conductive pillars 116 are sometimes referred to as through vias 116 or through integrated fan-out vias (TIVs) 116.

Figure 1B:
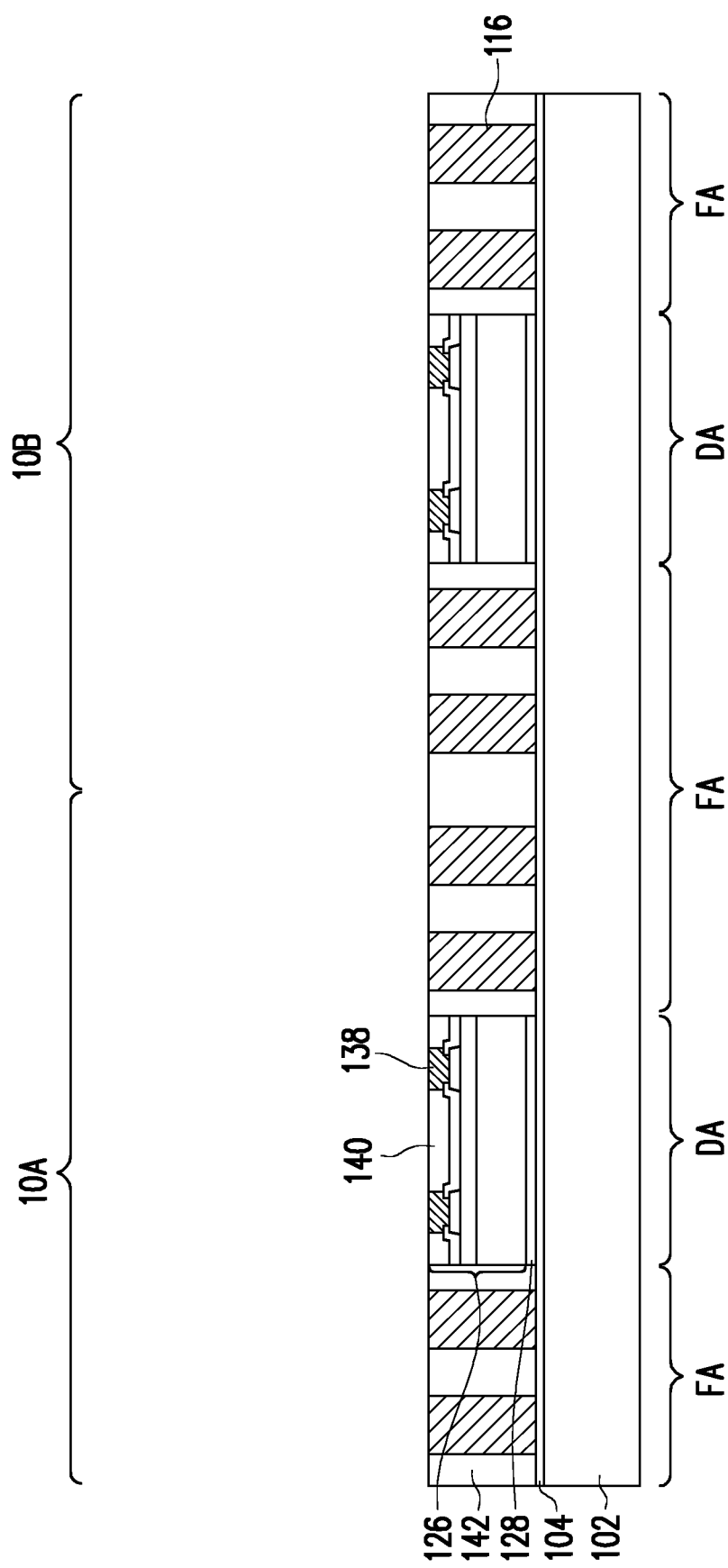

Referring to FIG. 1B, a planarization process is then performed on the encapsulant 142 to remove a portion of the encapsulant 142, such that the top surfaces of the through vias 116 and the die connectors 138 are exposed. In some embodiments in which the top surfaces of the through vias 116 and the front-side surfaces of the integrated circuit dies 126 are not coplanar (as shown in FIG. 1A), portions of the through vias 116 or/and portions of the dielectric material 140 may also be removed by the planarization process. In some embodiments, top surfaces of the through vias 116, the die connectors 138, the dielectric material 140, and the encapsulant 142 are substantially coplanar after the planarization process. The planarization process may be, for example, a chemical-mechanical polish (CMP), a grinding process, or the like. In some embodiments, the planarization may be omitted, for example, if the through vias 116 and die connectors 138 are already exposed.

Figure 1C:
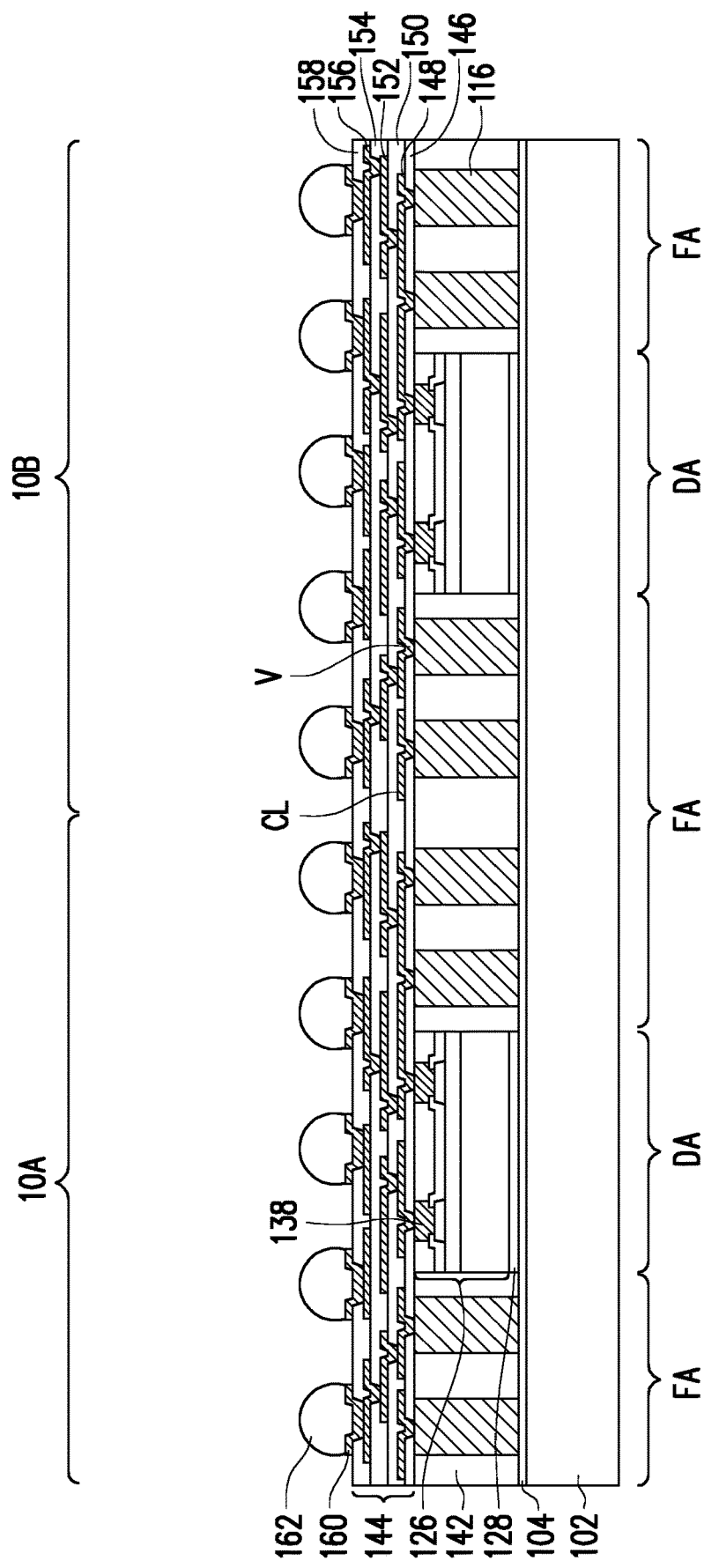

Referring to FIG. 1C, a front-side redistribution structure 144 is formed over front-side surfaces of the through vias 116, front-side surfaces of the encapsulant 142, and front-side surfaces of the integrated circuit dies 126. The front-side redistribution structure 144 includes dielectric layers 146, 150, 154, and 158; metallization patterns 148, 152, and 156; and under bump metallurgies (UBMs) 160. The metallization patterns may also be referred to as redistribution layers or redistribution lines. The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 144, the dielectric layer 146 is deposited on the encapsulant 142, the through vias 116, and the die connectors 138. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms openings exposing portions of the through vias 116 and the die connectors 138. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 may be developed after the exposure.

The metallization pattern 148 is then formed. The metallization pattern 148 includes conductive lines CL on and extending along the top surface of the dielectric layer 146.

The metallization pattern 148 further includes conductive vias V extending through the dielectric layer 146 to be physically and electrically connected to the through vias 116 and the integrated circuit dies 126. The sidewalls of the conductive vias V and the conductive lines CL may be straight or inclined. In some embodiments, the conductive via V has inclined sidewall and is tapered toward the integrated circuit dies 126. To form the metallization pattern 148, a seed layer is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 148. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 148. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layers 150, 154, 158, and the metallization patterns 152, 156 are formed alternately. The dielectric layer 150, 154, and 158 may be formed in a manner similar to the dielectric layer 146, and may be formed of the same material as the dielectric layer 146. The metallization patterns 152 and 156 may include conductive lines CL on the underlying dielectric layer and conductive vias V extending through the underlying dielectric layer respectively. The metallization patterns 152 and 156 may be formed in a manner similar to the metallization pattern 148, and may be formed of the same material as the metallization pattern 148. The UBMs 160 are optionally formed on and extending through the dielectric layer 158. The UBMs 160 may be formed in a manner similar to the metallization pattern 148, and may be formed of the same material as the metallization pattern 148.

Referring to FIG. 1C, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In another embodiment, the conductive connectors 162 may include a conductive material such as solder, copper, aluminum, gold, nickel, silver, palladium, tin, the like, or a combination thereof. In some embodiments, the conductive connectors 162 are formed by initially forming a layer of solder through such commonly used methods such as evaporation, electroplating, printing, solder transfer, ball placement, or the like. Once a layer of solder has been formed on the structure, a reflow process may be performed in order to shape the material into the desired bump shapes. During the reflow process, under the thermal impact, the device package 50 may become warped owing to the CTE mismatch between the integrated circuit dies 126.

Figure 1D:
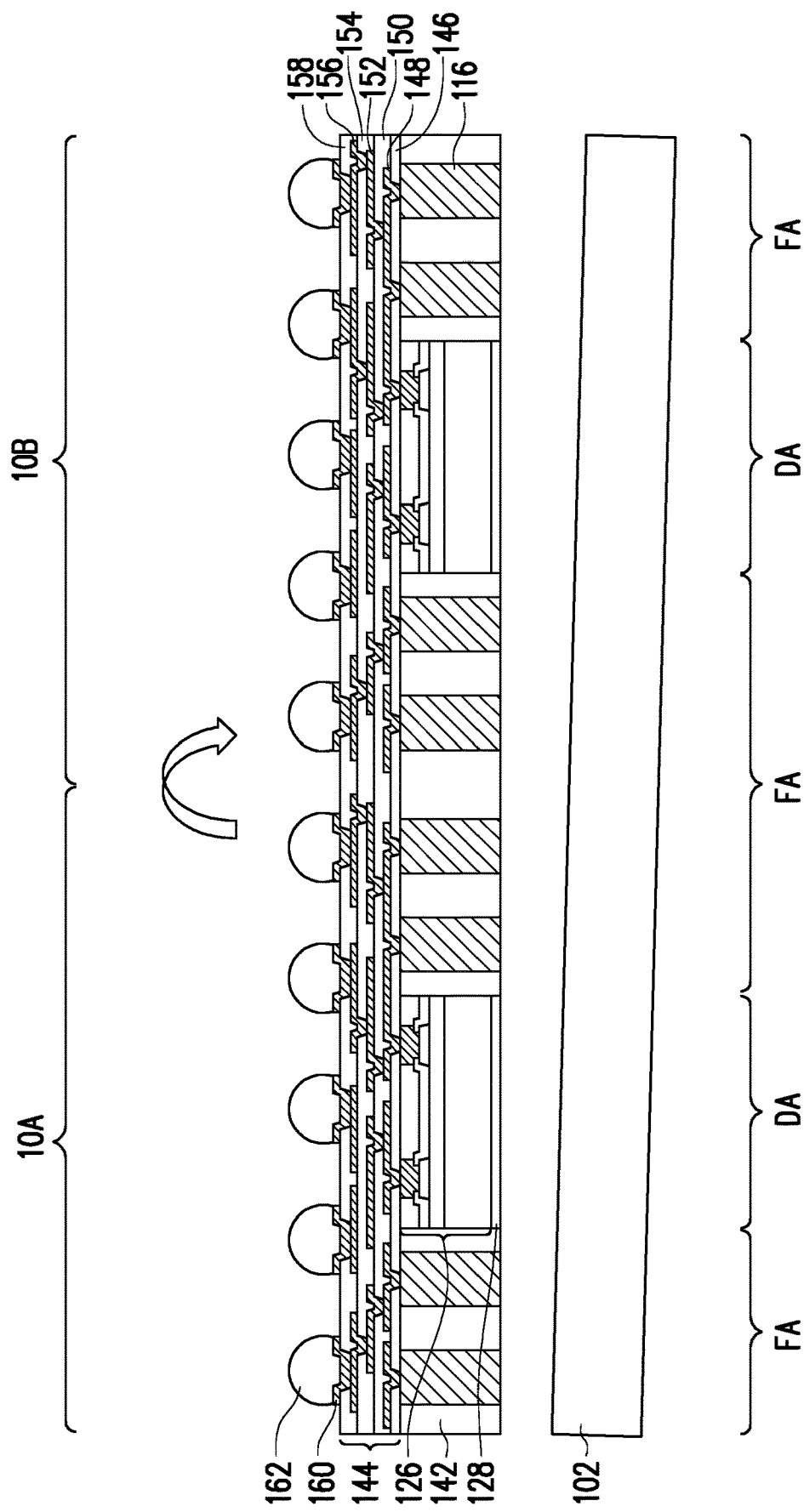
Figure 1E:
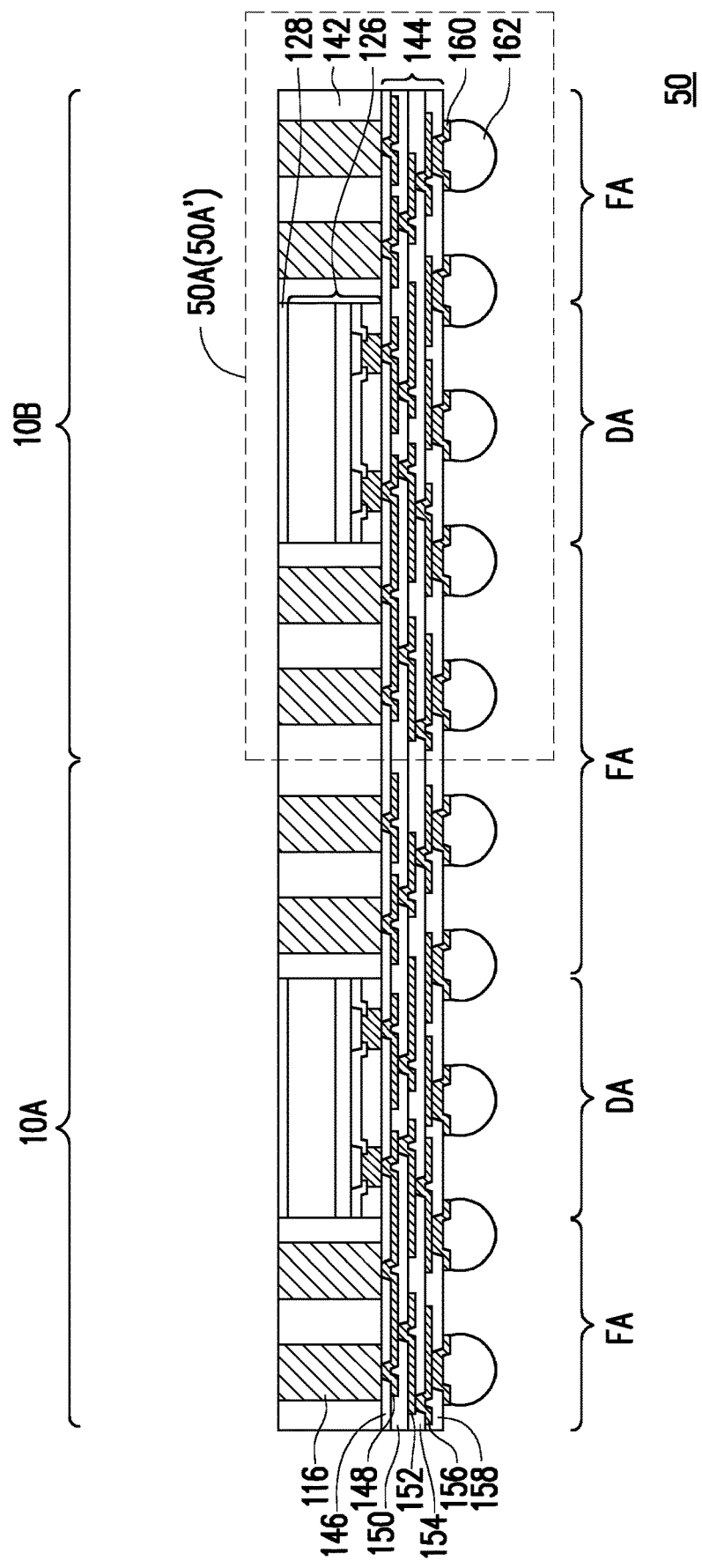
Figure 6:
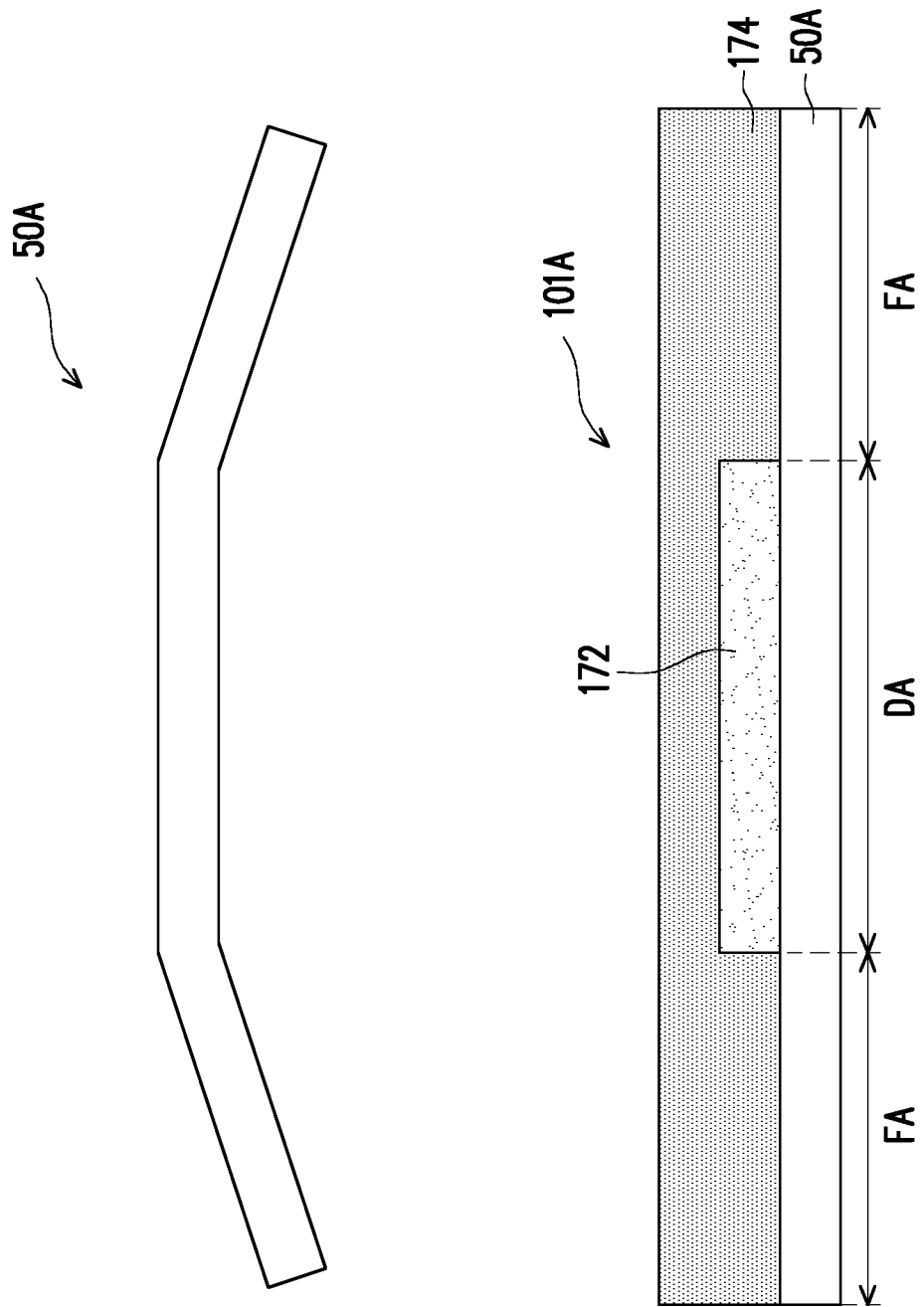
FIG. 6 is a schematic cross-sectional view illustrating package structures according to some embodiments of the disclosure.
Figure 11:
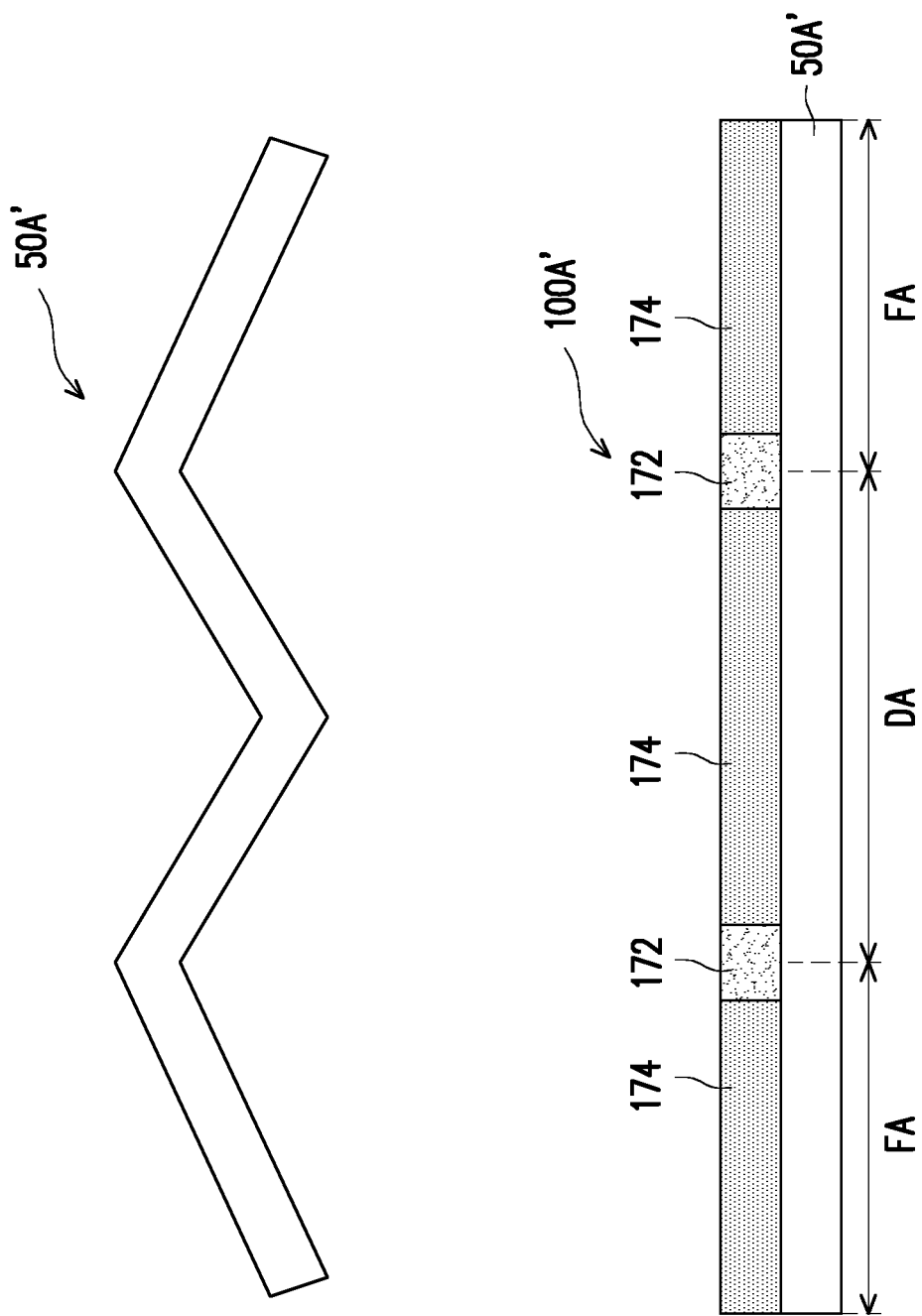
FIG. 11 is a schematic cross-sectional view illustrating package structures according to alternative embodiments of the disclosure.
Figure 16:
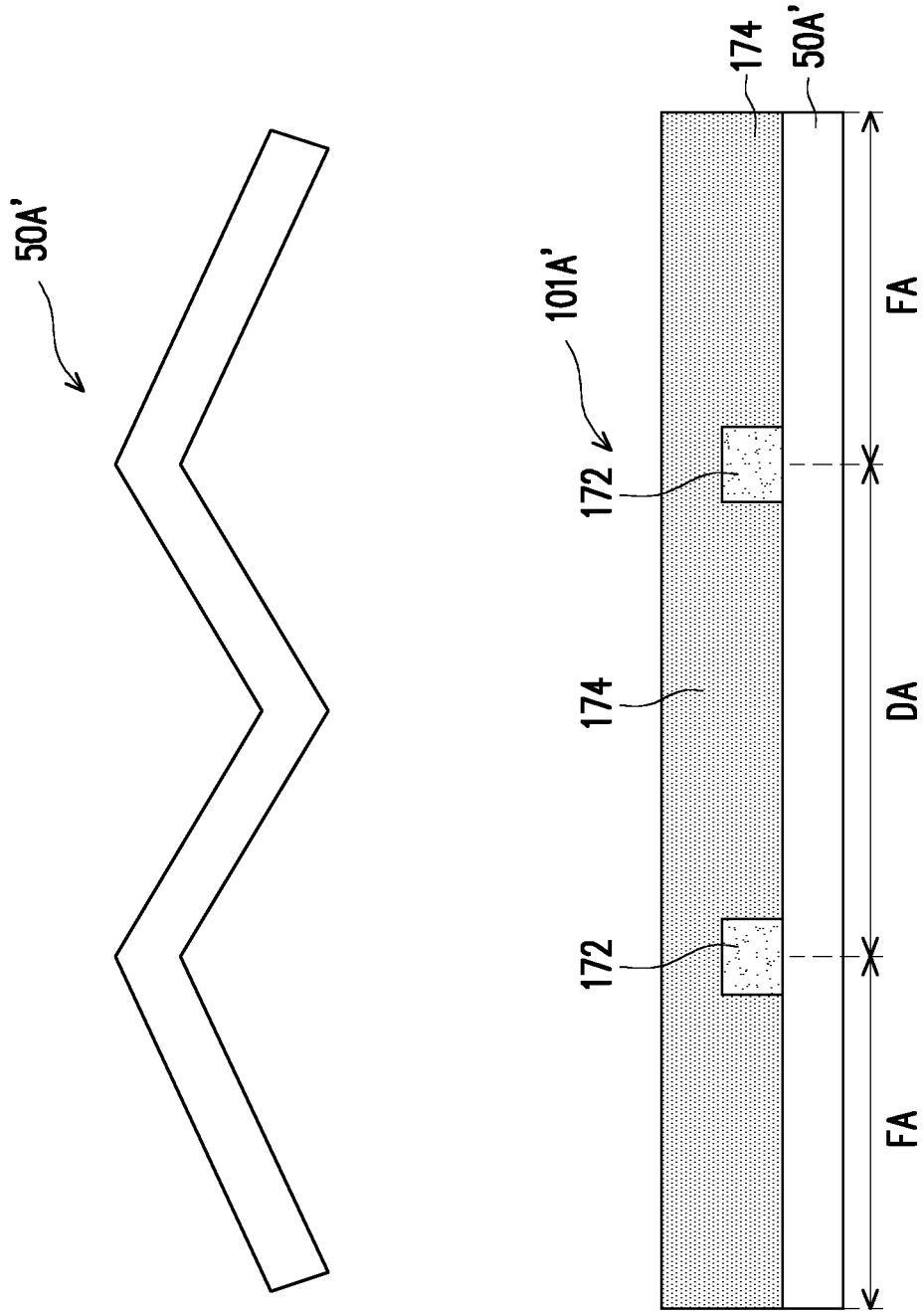
FIG. 16 is a schematic cross-sectional view illustrating package structures according to some embodiments of the disclosure.
Figure 17:
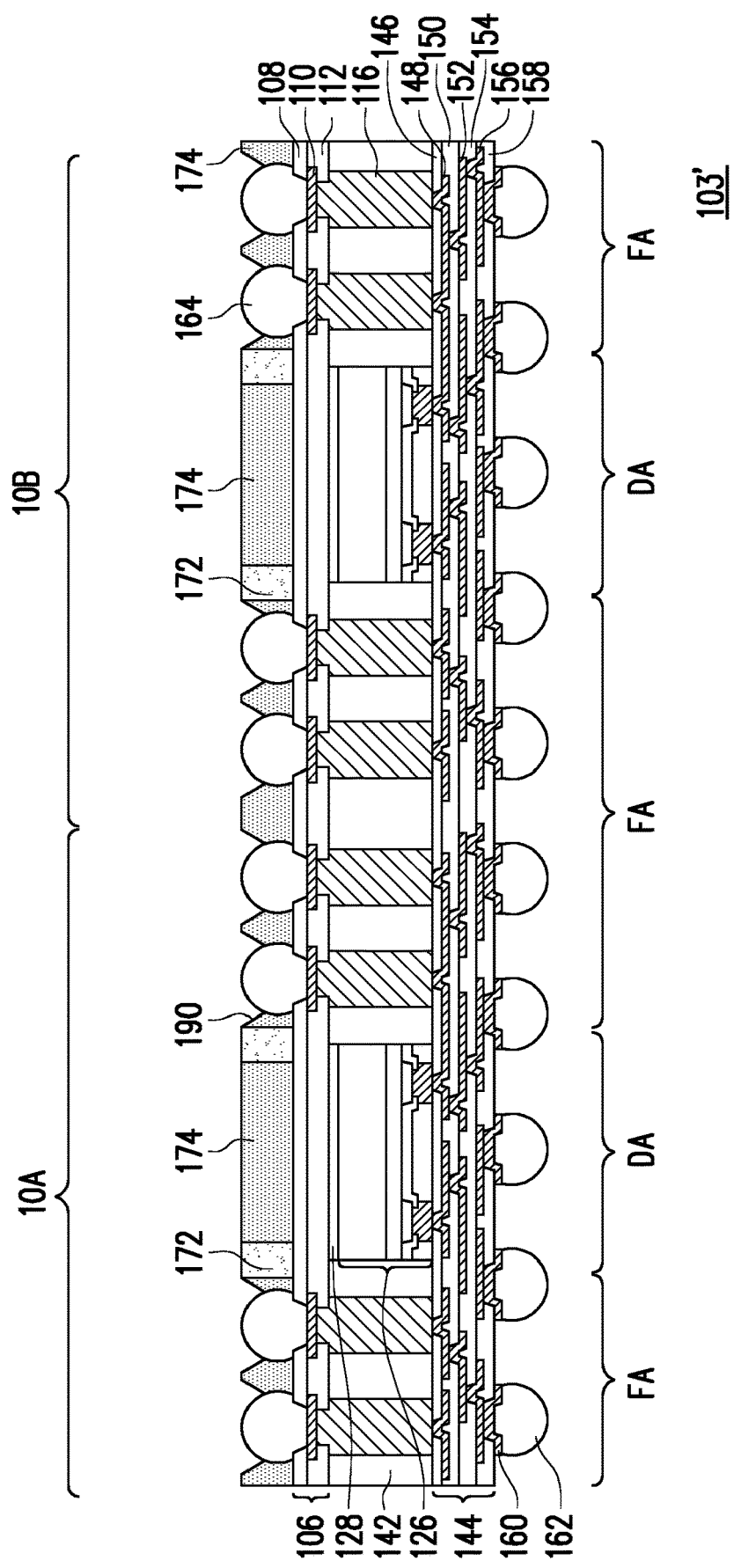
FIGS. 17, 18, 19 and 20 are schematic cross-sectional views illustrating device packages according to some embodiments of the disclosure.
Figure 18:
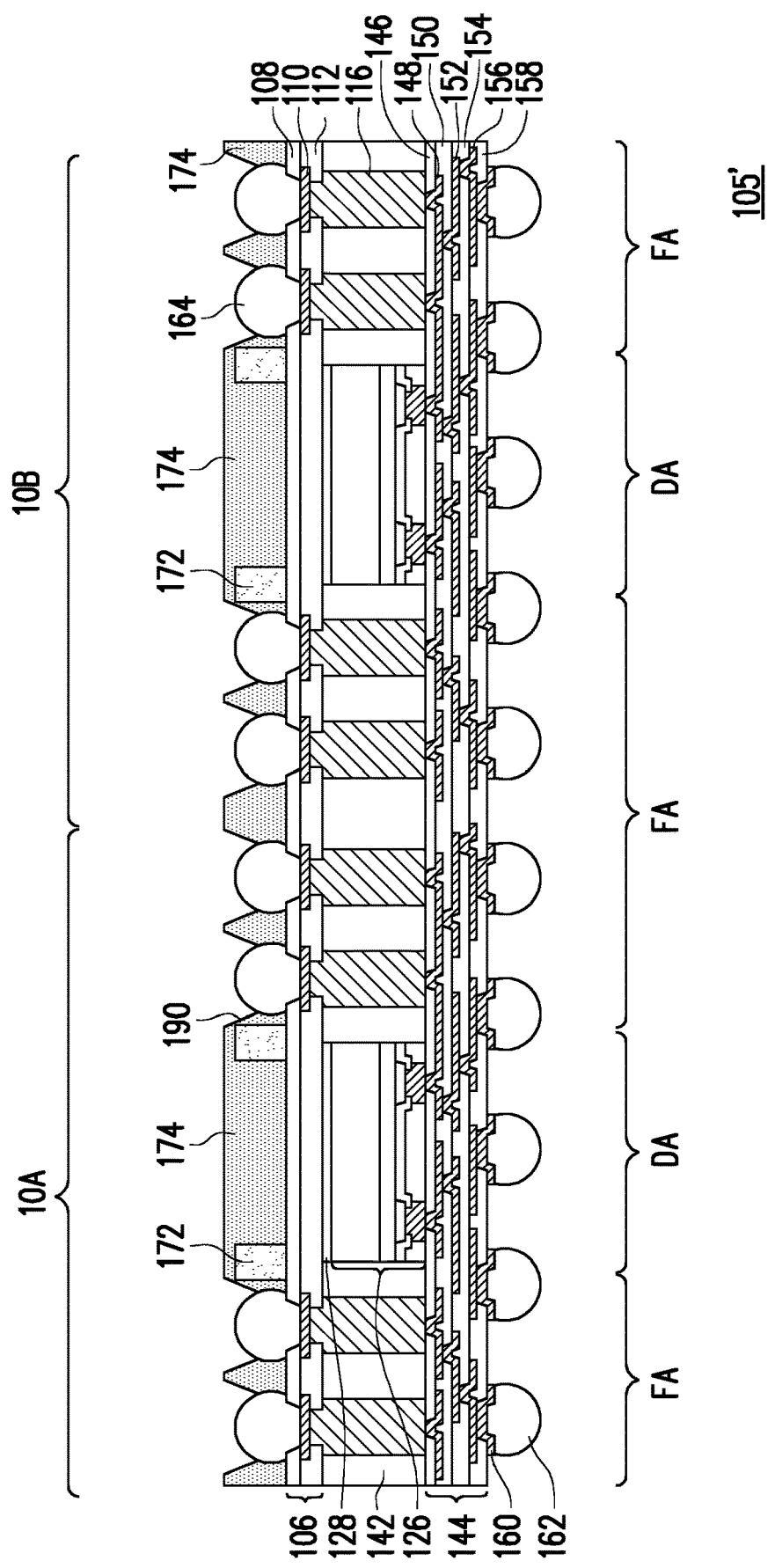
Figure 19:
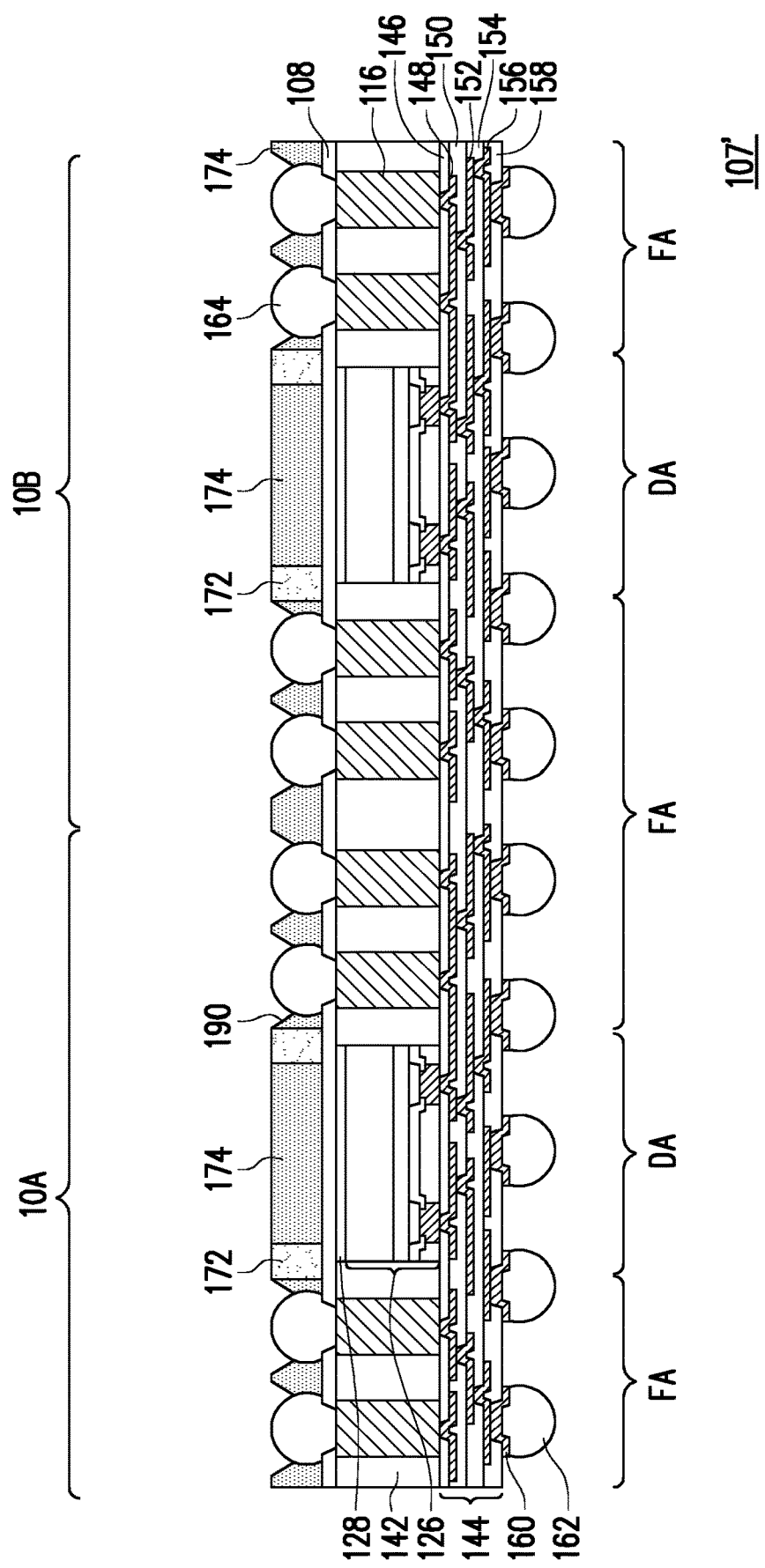
Figure 20:
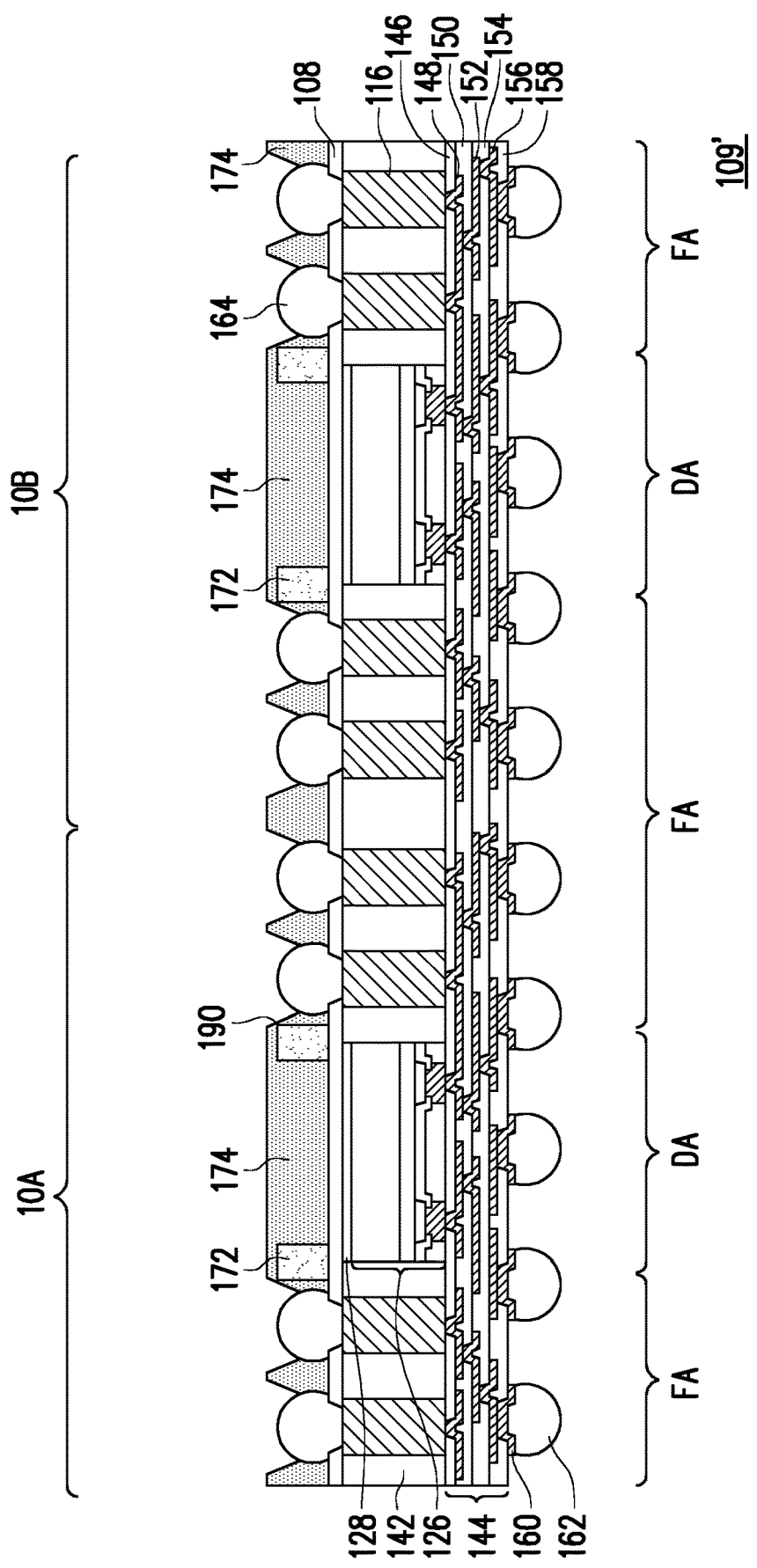

Referring to FIGS. 1D and 1E, a carrier substrate de-bonding is performed to detach (or "de-bond") the carrier substrate 102 from the encapsulant 142 and the adhesive 128 to form a device package 50. In accordance with some embodiments, the de-bonding includes projecting a light such as a laser light or an UV light on the release layer 104 so that the release layer 104 decomposes under the heat of the light and the carrier substrate 102 may be removed. The device package 50 is then flipped over and placed on a tape (not shown). In some embodiments, after the device package 50 is flipped, a package structure 50A of the device package 50 has a convex shape (so called crying-shape) as shown in FIGS. 2 and 6. In alternative embodiments, after the device package 50 is flipped, a package structure 50A' of the device package 50 has a "M" shape as shown in FIGS. 11 and 16.

Figure 1F:
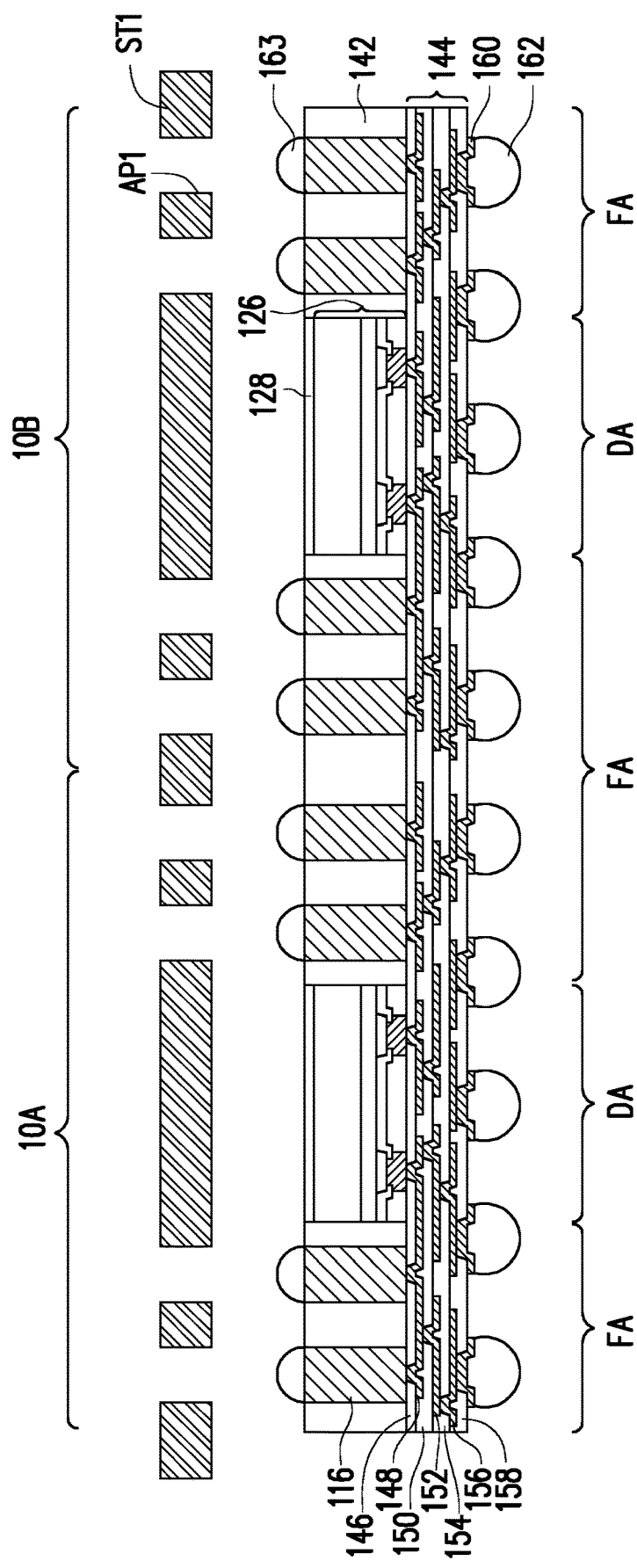

Referring to FIG. 1F, conductive pastes 163 are formed to contact the through vias 116. In some embodiments, the conductive pastes 163 comprise a conductive paste such as solder paste, silver paste, or the like, and are dispensed in a printing process. In other some embodiments, the conductive pastes 163 comprise flux and are formed in a flux dipping process. In some embodiments, the conductive pastes 163 are formed in a manner similar to the conductive connectors 162, and may be formed of the same material as the conductive connectors 162.

The conductive pastes 163 may be dispensed in a printing process. In some embodiments, the conductive pastes 163 is formed by the following process: a stencil ST1 is placed over the adhesive 128 in the die areas DA. The stencil ST1 may be a two-dimensional stencil. The stencil ST1 has a plurality of apertures AP1. A location of the apertures AP1 of the stencil ST1 corresponds to the through vias 116 in the fan-out areas FA.

A shape of the apertures AP1 of the stencil ST1 corresponds to a shape of the through vias 116. In some embodiments, a profile of the apertures AP1 is conformal with a profile of the through vias 116. In some embodiments, the apertures AP1 of the stencil ST1 is smaller than or equal to the size of the through vias 116. In some embodiments, the stencil ST1 is placed over the die areas DA such that the apertures AP1 and the through vias 116 are coaxial.

Referring to FIG. 1F, the conductive pastes 163 are applied onto the exposed portions of the through vias 116. For example, the conductive pastes 163 are applied onto the stencil ST1 by a dispenser (not shown). Subsequently, a squeegee (not shown) may be adapted to scrape the conductive pastes 163 into the apertures AP1 of the stencil ST1. In other words, the conductive pastes 163 is filled into the apertures AP1 of the stencil ST1. The stencil ST1 is then removed.

Figure 1G:
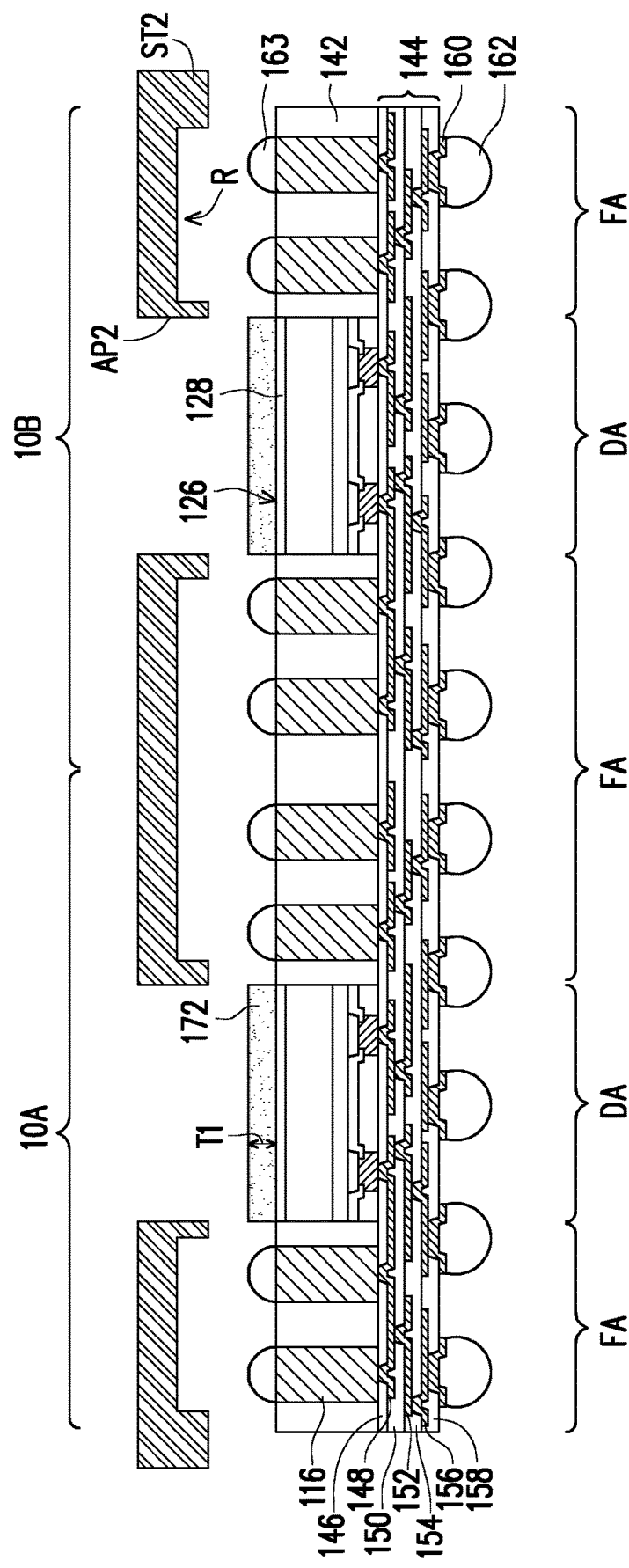
Figure 3A:
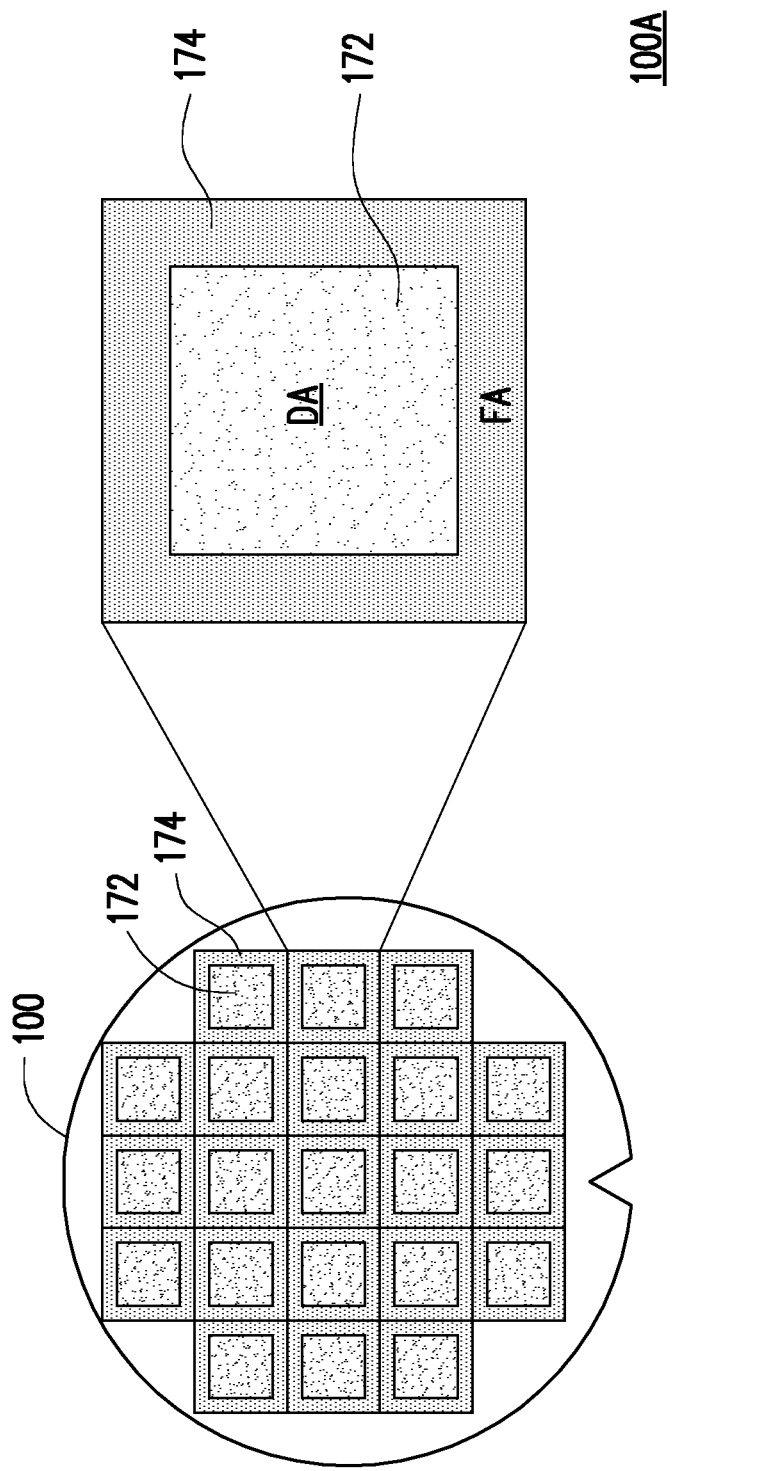
FIGS. 3A through 3B are schematic top views illustrating a method of manufacturing a device package according to other some embodiments of the disclosure.

Referring to FIGS. 1G and 3A, after the conductive pastes 163 are formed, the warpage control material 172 is formed on designed areas. In some embodiments in which the package structure 50A has the convex shape as shown in FIG. 2, the designed areas may be the entire die areas DA.

The entire surface of the integrated circuit dies 126 is cover by the warpage control material 172. In other some embodiments, the designed areas may be portions of the die areas DA such as center portions of the die areas DA (not shown). The warpage control material 172 has, for example, a block shape from a top view.

A material of the warpage control material 172 is different from a material of the adhesive 128. The warpage control material 172 has a coefficient of thermal expansion (CTE) in a suitable range to reduce the CTE mismatch between the CTE of the integrated circuit dies 126 and the encapsulant 142. In some embodiments, the CTE of the warpage control material 172 is greater than the CTEs of the integrated circuit dies 126, the adhesive 128, the encapsulant 142 and a protection layer 174 (shown in FIGS. 1H and 3A).

Therefore, the presence of the warpage control material 172 may help reduce the CTE mismatch and thus avoiding or reducing warpage caused by the CTE mismatch. For example, the CTE of the encapsulant 142 is less than 20 ppm/° C. in a temperature range under glass transition temperature (Tg), and 40 ppm/° C. to 80 ppm/° C. in a temperature range higher than Tg. The CTE of the warpage control material 172 is 10 ppm/° C. to 40 ppm/° C. in a temperature range under glass transition temperature (Tg), and 40 ppm/° C. to 200 ppm/° C. in a temperature range higher than Tg. However, the disclosure is not limited thereto.

The warpage control material 172 has a Young's Modulus in a suitable range to reduce warpage of the device package 50. In some embodiments, the Young's Modulus of the warpage control material 172 is greater than the Young's Modulus of the adhesive 128, the protection layer 174 and the encapsulant 142, and less than the Young's Modulus of the integrated circuit dies 126. For example, the Young's Modulus of the warpage control material 172 ranges from 10 Gpa to 30 Gpa at room temperature.

The warpage control material 172 may be a glue, a liquid, a paste, a film or a combination thereof. In some embodiments, the viscosity of the warpage control material 172 is greater than the viscosities of the protection material 174, the encapsulate 142 and the adhesive 128 at room temperature or a temperature range of 50° C. to 100° C. The viscosity of the warpage control material 172 ranges from 100 Pa·s to 200 Pa·s at room temperature.

In some embodiments, the warpage control material 172 is a single layer structure, but the disclosure is not limited thereto. In alternative embodiments, the warpage control material 172 is a multi-layer structure. The warpage control material 172 may include one or more material selected from epoxy, resin, glass fiber, prepreg (which comprises epoxy, resin, and/or glass fiber), polyimide, combinations thereof, or multi-layers thereof.

In some embodiments, the warpage control material 172 includes a composite material including a base material (such as epoxy) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. The cross-section shape of the filler may be circle, oval, or any other shape. In some embodiments, the fillers include solid fillers, but the disclosure is not limited thereto. In some embodiments, a small portion of the fillers may be hollow fillers.

The filler size and filler content of the warpage control material 172 are controlled in a suitable range, and suitable base material and additives are selected to form the warpage control material 172, such that the warpage control material 172 has a good property to reduce warpage of the device package 50. For example, the average filler size of the filler may be less than 30 μm. In some embodiments, the content of the fillers in the warpage control material 172 is greater than 50 wt %, such as 50 wt % to 90 wt % or more, based on the total weight of the warpage control material 172. In some embodiments, the average filler size and filler content of the filler in the warpage control material 172 is less than the average filler size and filler content of the filler in the encapsulate 142. The materials of the warpage control material 172 described above are merely for illustration, and the disclosure is not limited thereto.

The warpage control material 172 may be formed in a printing process. In some embodiments, the warpage control material 172 is formed by the following process: a stencil ST2 is placed over the conductive pastes 163 and the encapsulant 142. The stencil ST2 may be a tree-dimensional stencil.

The stencil ST2 has a plurality of ring recess R and a plurality of apertures AP2. In some embodiments, locations of the ring recesses R of the stencil ST2 correspond to locations of the fan-out areas FA around the die areas DA. Locations of the apertures AP2 of the stencil ST2 correspond to locations of the die areas DA.

The ring recess R has a depth greater than a height of the conductive pastes 163, so that a space of the ring recess R may accommodate the conductive pastes 163. The shape of the apertures AP2 of the stencil ST2 correspond to the shape of the adhesive 128. For example, both of the apertures AP2 and the adhesive 128 may have a square or elongated shape from a top view. In some embodiments, a profile of the apertures AP2 is conformal with a profile of the adhesive 128. In some embodiments, the apertures AP2 of the stencil ST2 is smaller than or equal to the size of the adhesive 128. In some embodiments, the stencil ST2 is placed over the fan-out areas FA such that the apertures AP2 and the integrated circuit dies 126 are coaxial. As illustrated in FIG. 1G, the apertures AP2 expose at least a portion of each adhesive 128.

Referring to FIG. 1G, the warpage control material 172 is applied onto the exposed portion of the adhesive 128. For example, the warpage control material 172 is applied onto the stencil ST2 by a dispenser (not shown). Subsequently, a squeegee (not shown) may be adapted to scrape the warpage control material 172 into the apertures AP2 of the stencil ST2. In other words, the warpage control material 172 is filled into the apertures AP2 of the stencil ST2. In some embodiments, the square or elongated shape nature of the apertures AP2 shapes the warpage control material 172 filled therein to have square or elongated shape from a top view.

Figure 1H:
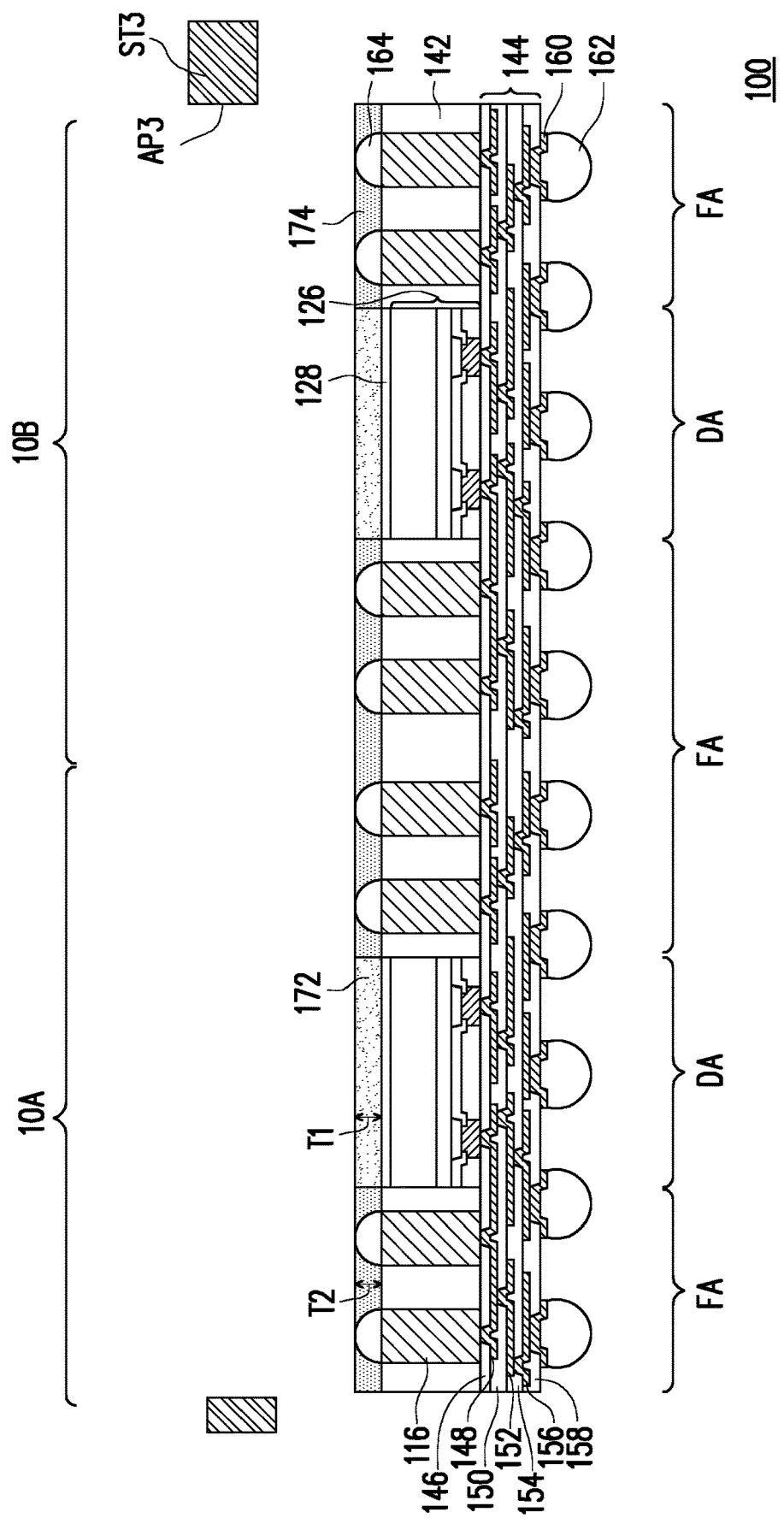

Referring to FIG. 1G and FIG. 1H, the stencil ST2 is then removed. The forming method of the warpage control material 172 described above is merely for illustration, and the disclosure is not limited thereto. In some other embodiments, the warpage control material 172 may be formed by dispensing or lamination processes.

Still referring to FIG. 1G, the warpage control material 172 may have a thickness T1 greater than 50 μm, such as in a range of 50 μm to 150 μm, but the disclosure is not limited thereto. In some embodiments, the warpage control material 172 may have substantially uniform thickness across a top surface of the adhesive 128. In alternative embodiments, the warpage control material 172 may have different thicknesses in different regions over the adhesive 128. In some embodiments, a warpage degree of the package in a first region of the die areas DA is greater than a warpage degree of the package in a second region of the die areas DA. The warpage control material 172 formed in the first region may be thicker than the warpage control material 172 formed in the second regions.

Referring to FIG. 1H, a reflow process may be performed. The reflow process includes performing a thermal heating process at a reflow temperature, so that the conductive pastes 163 turns into a melted state or a semi-melted state to form conductive connectors 164. The reflow temperature of the conductive pastes 163 is required to be higher than a melting point of the conductive pastes 163. In some embodiments, the conductive pastes 163 have a melting temperature higher than about 200° C., and may be in the range of from about 215° C. to about 230° C. The power of a reflow oven for the reflow process may be adjusted to obtain a particular heating rate and peak temperature. In an embodiment, the peak temperature is in a range of from about 240° C. to about 250° C.

In FIGS. 1H and 3A, the protection material 174 is formed on the fan-out areas FA. A material of the protection material 174 may be different from a material of the warpage control material 172, a material of the encapsulant 142 and a material of the adhesive 128. In some embodiments, the protection material 174 is a single layer structure, but the disclosure is not limited thereto. In alternative embodiments, the protection material 174 is a multi-layer structure.

In some embodiments, the material of the protection material 174 may be the same as the materials of the dielectric layers 146, 150, 154, or 158. The protection material 174 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the protection material 174 includes nitride such as silicon nitride, oxide such as silicon oxide, phosphosilicate glass (PSG), borosilicate glass (BSG), boron-doped phosphosilicate glass (BPSG), a combination thereof, or the like.

In alternative embodiments, the protection material 174 may be similar to the material of warpage control material 172. The protection material 174 may include a base material (such as epoxy). The protection material 174 may further include a plurality of fillers in the base material or does not include any filler in the base material. In some embodiments, the average filler size and filler content of the filler in the protection material 174 is less than the average filler sizes and filler contents of the filler in the warpage control material 172 and the encapsulate 142. The materials of the warpage control material 172 described above are merely for illustration, and the disclosure is not limited thereto.

In some embodiments, the protection material 174 is a comparable CTE material having a coefficient of thermal expansion (CTE) in a suitable range. The protection material 174 may be used to reduce the CTE mismatch. In some embodiments, the CTE of the protection material 174 is greater than the CTEs of the integrated circuit dies 126 and the adhesive 128, and less than the CTEs of the encapsulant 142 and the warpage control material 172. Therefore, the presence of the protection material 174 may help reduce the CTE mismatch and thus avoiding or reducing warpage. For example, the CTE of the encapsulant 142 is less than 20 ppm/° C. in a temperature range under glass transition temperature (Tg), and 40 ppm/° C. to 80 ppm/° C. in a temperature range higher than Tg. The CTE of the warpage control material 172 is 10 ppm/° C. to 40 ppm/° C. in a temperature range under glass transition temperature (Tg), and 40 ppm/° C. to 200 ppm/° C. in a temperature range higher than Tg. The CTE of the protection material 174 is less than 60 ppm/° C. in a temperature range under glass transition temperature (Tg), and less than 200 ppm/° C. in a temperature range higher than Tg.

In some embodiments, the Young's Modulus of the protection material 174 is greater than the Young's Modulus of the adhesive 128, and less than the Young's Modulus of the integrated circuit dies 126, the warpage control material 172, and the encapsulant 142. The Young's Modulus of the protection material 174 is less than 10 Gpa at room temperature.

The protection material 174 may a glue, a liquid, a paste, a film or a combination thereof. The viscosity of the protection material 174 is greater than the viscosity of the adhesive 128, and less than the viscosities of the warpage control material 172 and the encapsulate 142 at room temperature or a temperature range of 50° C. to 100° C. The viscosity of the protection material 174 is less than 10 Pa·s at room temperature.

In some embodiments, the protection material 174 is formed in a printing process as the following: a stencil ST3 is placed over the device package 50. The stencil ST3 may be a tree-dimensional stencil having an aperture AP3. A location of the aperture AP3 of the stencil ST3 corresponds to the locations of the die areas DA and the fan-out areas FA. A shape of the apertures AP3 of the stencil ST3 corresponds to a shape of the device package 100. In some embodiments, a profile of the apertures AP3 is conformal with a profile of the device package 50. In some embodiments, the apertures AP3 of the stencil ST3 is smaller than or equal to the size of the device package 100.

Referring to FIG. 1H and FIG. 3A, the protection material 174 is applied onto the exposed portion of the conductive connectors 164, the through vias 116 and the encapsulant 142. For example, the protection material 174 is applied onto the stencil ST3 by a dispenser (not shown). Subsequently, a squeegee (not shown) may be adapted to scrape the protection material 174 into the apertures AP3 of the stencil ST3.

Figure 1I:
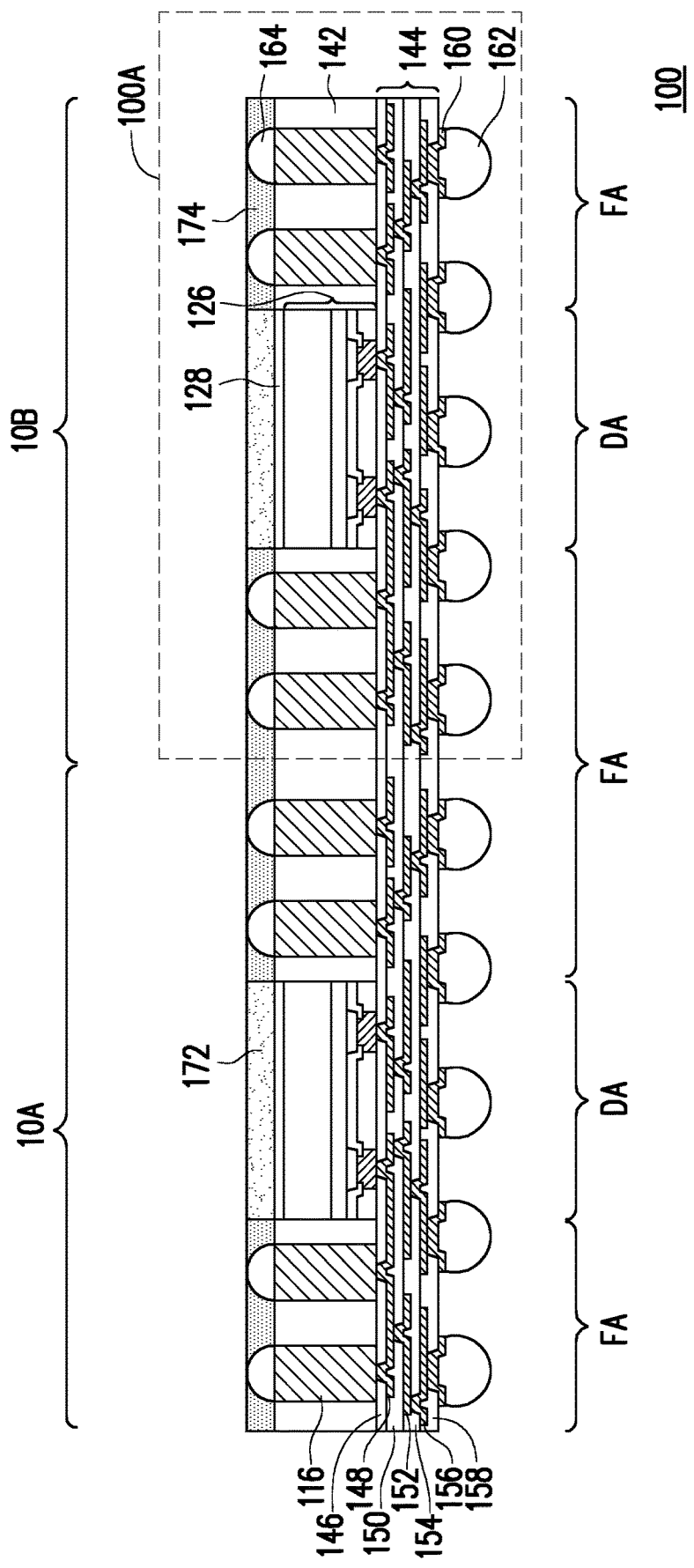

Referring to FIG. 1I, the stencil ST3 is then removed. In some embodiments, the protection material 174 may cover the top surfaces and the sidewalls of the conductive connectors 164, the top surfaces of the through vias 116 and the top surface of the encapsulant 142 in the fan-out areas FA, and expose top surfaces of the warpage control material 172 in the die areas DA as shown in FIGS. 1I and 3A. The protection material 174 may have a thickness T2 in a range of 50 μm to 160 μm. In some embodiments, the thickness T2 of the protection material 174 is the same as the thickness T1 of the warpage control material 172. The top surfaces of the protection material 174 and the top surfaces the warpage control material 172 are coplanar, and bottom surface of the protection material 174 and bottom surfaces the warpage control material 172 are coplanar.

Figure 4A:
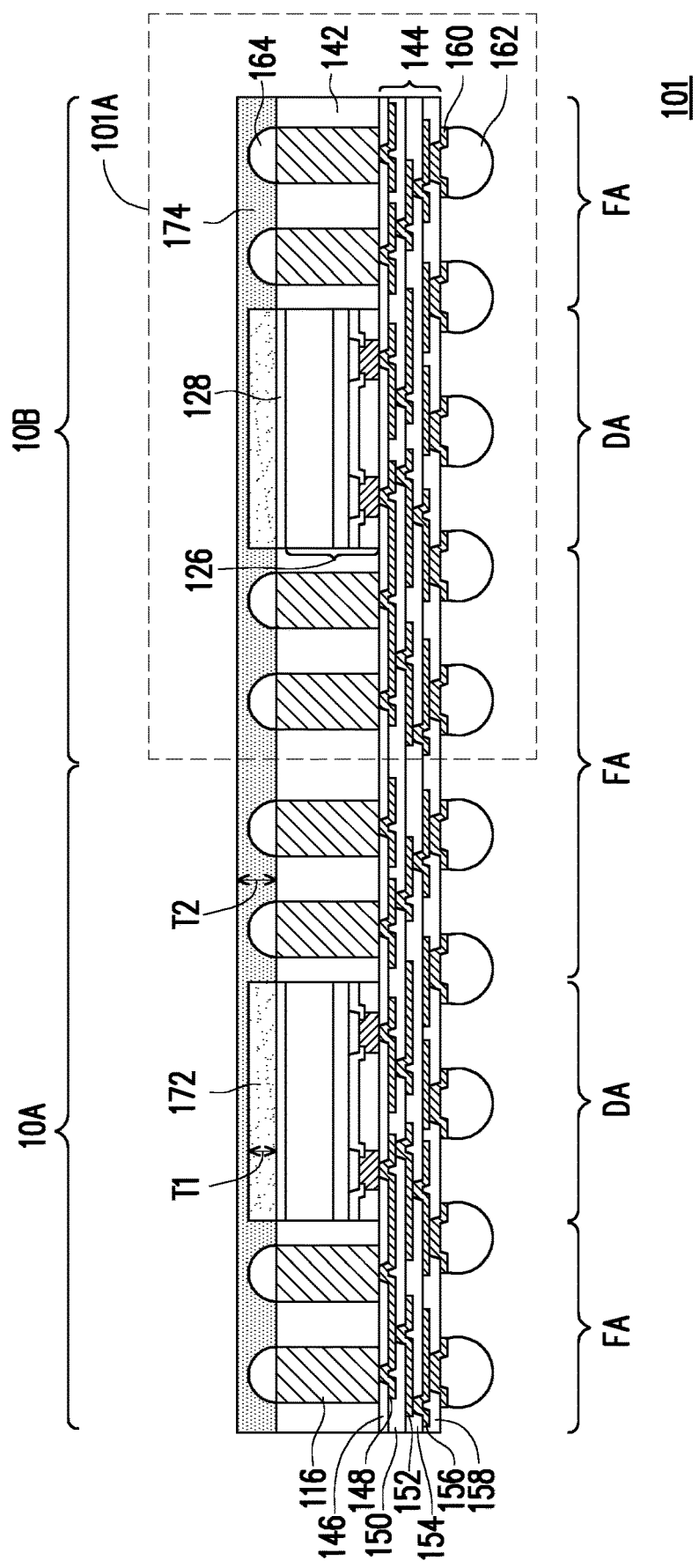
FIGS. 4A through 4B are schematic cross-sectional views illustrating a method of manufacturing a device package according to other some embodiments of the disclosure.
Figure 5A:
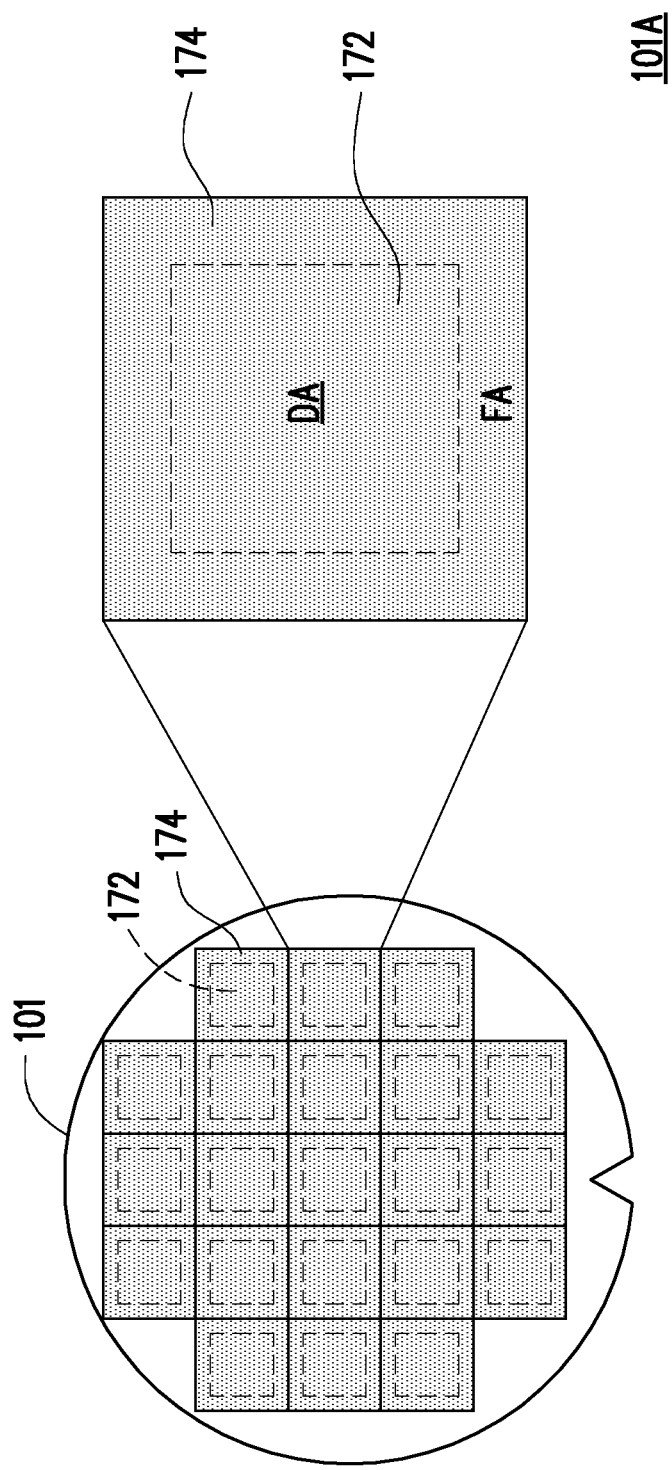
FIGS. 5A through 5B are schematic top views illustrating a method of manufacturing a device package according to other some embodiments of the disclosure.

In other some embodiments, the bottom surface of the protection material 174 and the bottom surfaces the warpage control material 172 are coplanar, and the thickness T2 of the protection material 174 is greater than the thickness T1 of the warpage control material 172 as shown in FIGS. 4A and 5A. The protection material 174 covers the top surfaces and the sidewalls of the conductive connectors 164, the top surfaces of the through vias 116 and the encapsulant 142 in the fan-out areas FA, and the top surfaces of the warpage control material 172 in the die areas DA. The protection material 174 may have the thickness T2 in a range of 60 μm to 160 μm.

The protection material 174 is cured. In some embodiments, the curing process of the protection material 174 may include performing a thermal heating process or thermal treatment at a curing temperature higher than about 200° C. The forming method of the protection material 174 described above is merely for illustration, and the disclosure is not limited thereto. In some other embodiments, the protection material 174 may be formed by dispensing or lamination processes.

Referring to FIGS. 1J and 3B, and FIGS. 4B and 5B, openings 190 are formed through the protection material 174 to expose the top surfaces of the conductive connectors 164. The openings 190 may be formed, for example, using laser drilling, laser trimming, etching, or the like. At this stage, device packages 100 and 101 are substantially completed.

Figure 1J:
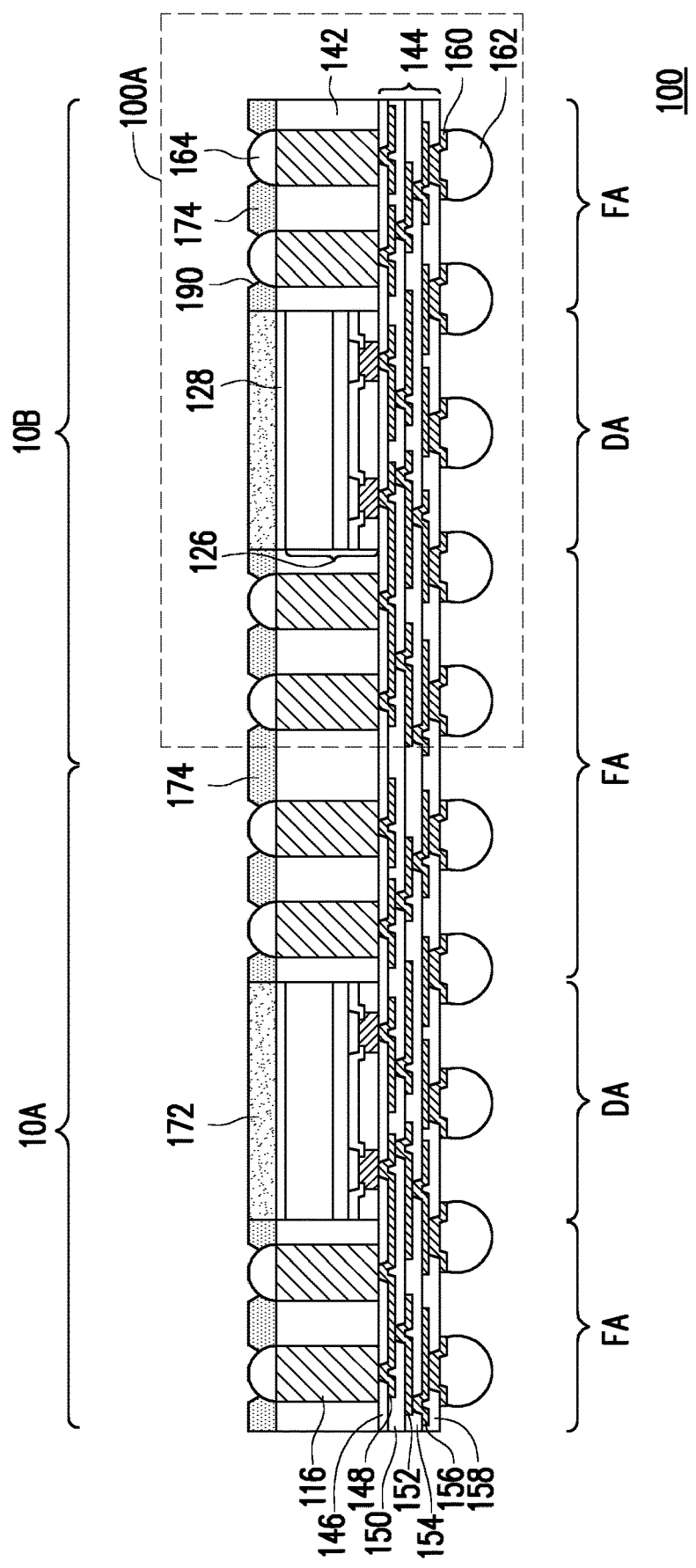
Figure 3B:
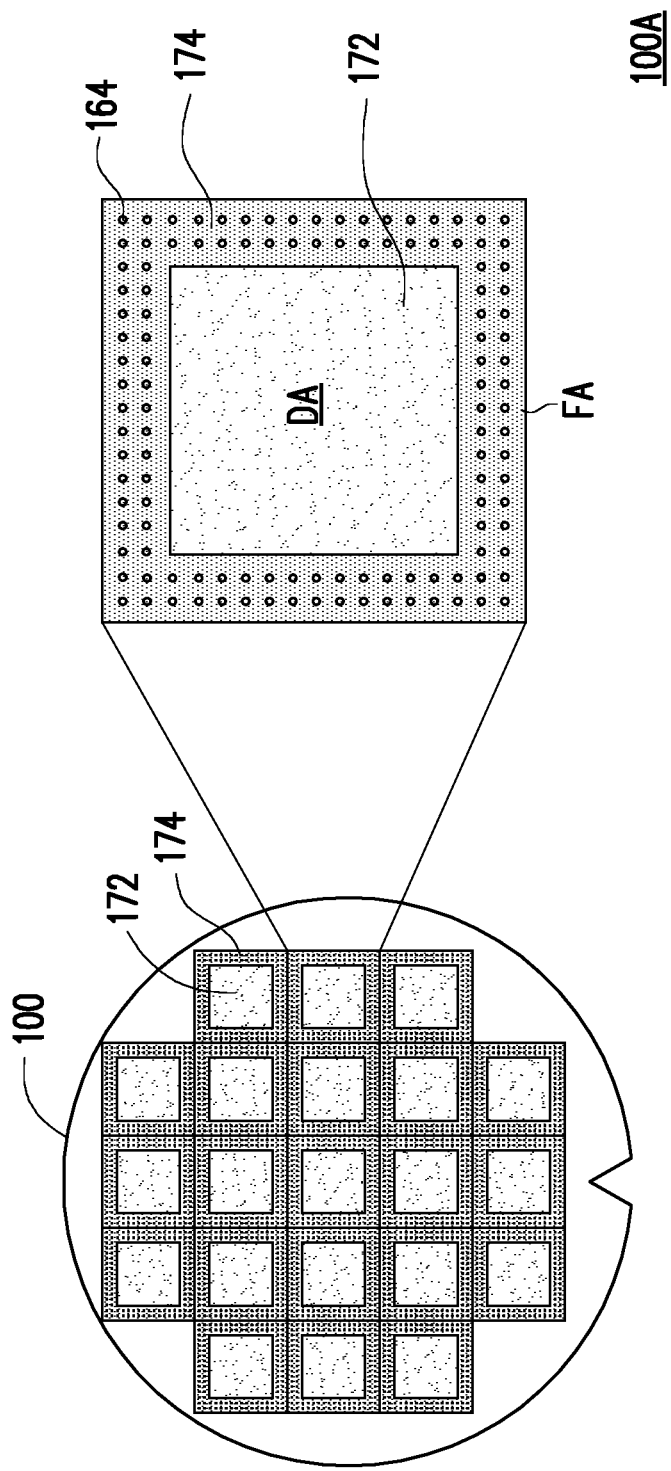
Figure 4B:
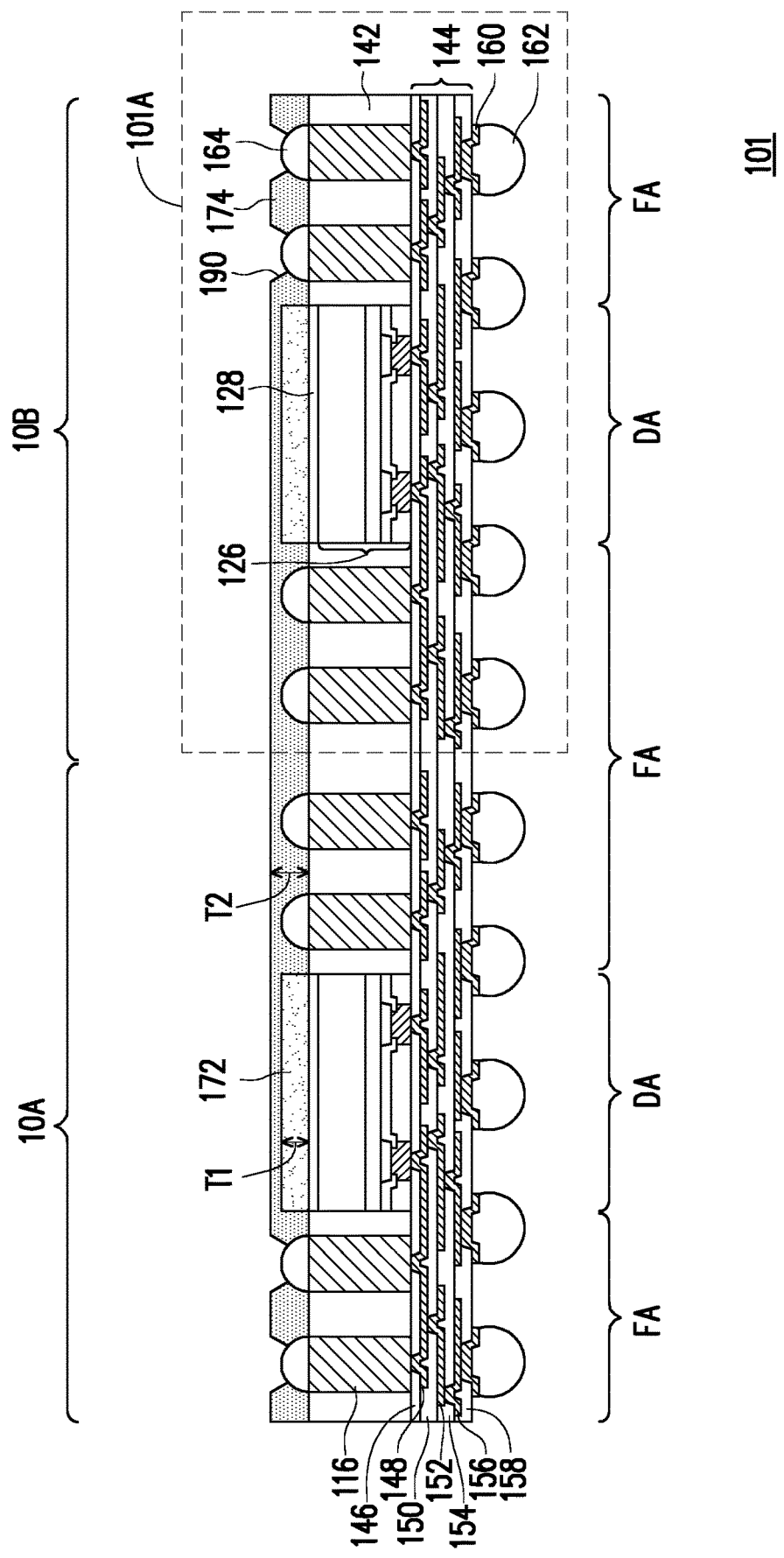

Referring to FIGS. 1J and 3B, in the device package 100, the remaining protection material 174 is in contact with portion surfaces of the conductive connectors 164, the top surface of the encapsulate 142 in the fan-out areas FA and sidewalls of the warpage control material 172. In other words, the remaining protection material 174 separates the warpage control material 172 from the conductive connectors 164, and separates two adjacent conductive connectors 164.

Figure 5B:
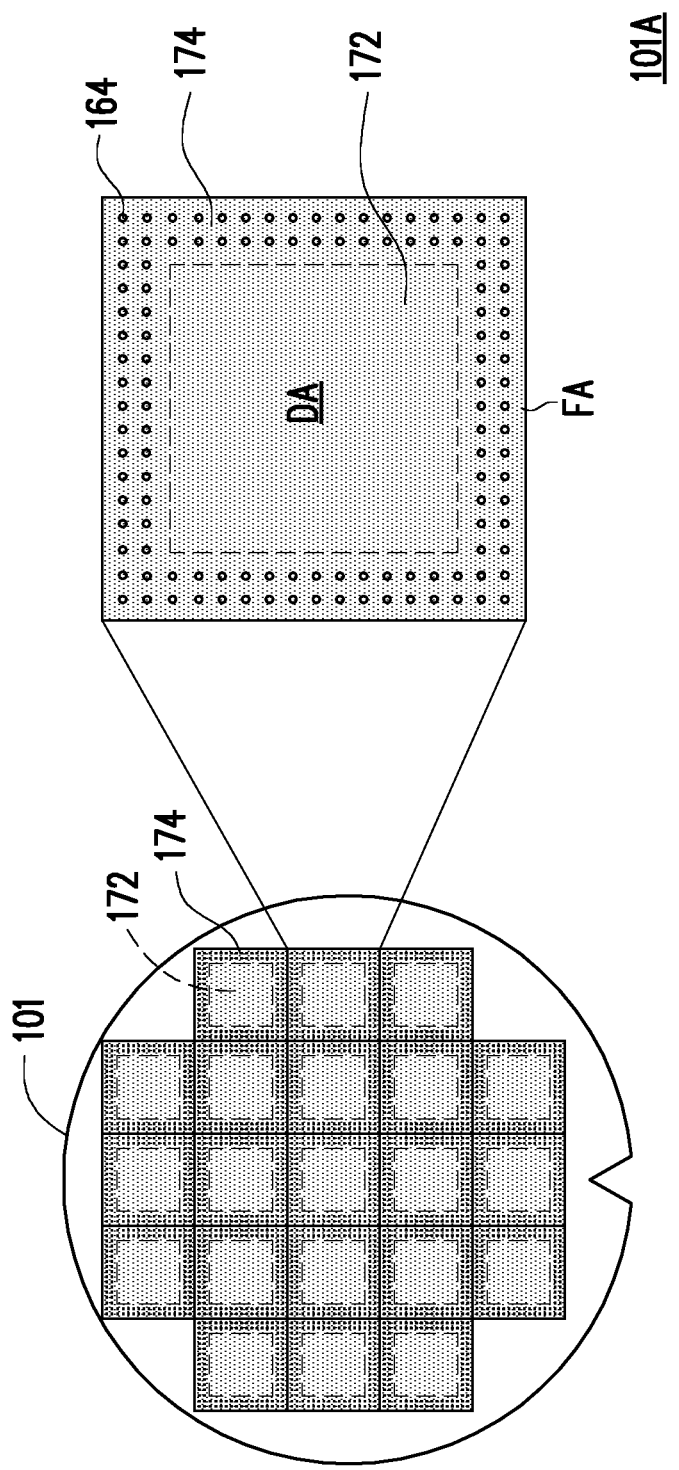

Referring to FIGS. 4B and 5B, in the device package 101, the remaining protection material 174 is in contact with portion surfaces of the conductive connectors 164, the top surface of the encapsulate 142 in the fan-out areas FA and sidewalls of the warpage control material 172, and further in contact with the top surfaces of the warpage control material 172 in the die areas DA.

Referring to FIGS. 2 and 6, after the warpage control material 172 and the protection material 174 are formed, the warpages of the package structure 100A of the device package 100 and the package structure 101A of the device package 101 are reduced.

FIGS. 7A through 7D are schematic cross-sectional views illustrating a method of manufacturing a device package according to some embodiments of the disclosure. FIG. 8 is schematic cross-sectional view illustrating a device package according to some embodiments of the disclosure.

Referring to FIG. 7A, a carrier substrate 102 is provided, and a release layer 104 is formed on the carrier substrate 102. In embodiments where the integrated circuit die 126 have a large footprint, the space available for the conductive pillars 116 in the package regions may be limited. Use of a back-side redistribution structure 106 allows for an improved interconnect arrangement when the package regions have limited space available for the conductive pillars 116. Therefore, before conductive pillars 116 are formed, the back-side redistribution structure 106 is formed on the release layer 104 in the die areas DA and the fan-out areas FA.

The back-side redistribution structure 106 may include a bottom dielectric layer 108, a metallization pattern 110, and a top dielectric layer 112. The bottom dielectric layer 108 is formed on the release layer 104. The bottom surface of the bottom dielectric layer 108 may be in contact with the top surface of the release layer 104. In some embodiments, the bottom dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 may also be referred to as redistribution layers or redistribution lines. The metallization pattern 110 is formed on the bottom dielectric layer 108. As an example to form the metallization pattern 110, a seed layer is formed over the bottom dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The top dielectric layer 112 is formed on the metallization pattern 110 and the bottom dielectric layer. In some embodiments, the top dielectric layer 112 is formed of a polymer, which may be a photo-sensitive material such as PBO, polyimide, BCB, or the like, that may be patterned using a lithography mask. In other embodiments, the top dielectric layer 112 is formed of a nitride such as silicon nitride; an oxide such as silicon oxide, PSG, BSG, BPSG; or the like. The top dielectric layer 112 may be formed by spin coating, lamination, CVD, the like, or a combination thereof. The top dielectric layer 112 is then patterned to form openings 114 exposing portions of the metallization pattern 110. The patterning may be by an acceptable process, such as by exposing the top dielectric layer 112 to light when the dielectric layer 112 is a photo-sensitive material or by etching using, for example, an anisotropic etch.

It should be appreciated that the back-side redistribution structure 106 may include any number of dielectric layers and metallization patterns. Additional dielectric layers and metallization patterns may be formed by repeating the processes for forming the metallization pattern and dielectric layer. The metallization patterns may include conductive lines and conductive vias. The conductive vias may be formed during the formation of the metallization patterns by forming the seed layer and conductive material of the metallization patterns in the opening of the underlying dielectric layer. The conductive vias may therefore interconnect and electrically couple the various conductive lines.

The conductive pillars 116 are formed on the top dielectric layer 112 and in contact with the metallization pattern 110 exposed by the openings (not shown) in the top dielectric layer 112. The integrated circuit dies 126 are adhered to the top dielectric layer 112 by an adhesive 128. The adhesive 128 may be applied to back-side surfaces of the integrated circuit dies 126 or may be applied over the surface of the back-side redistribution structure 106.

Figure 7B:
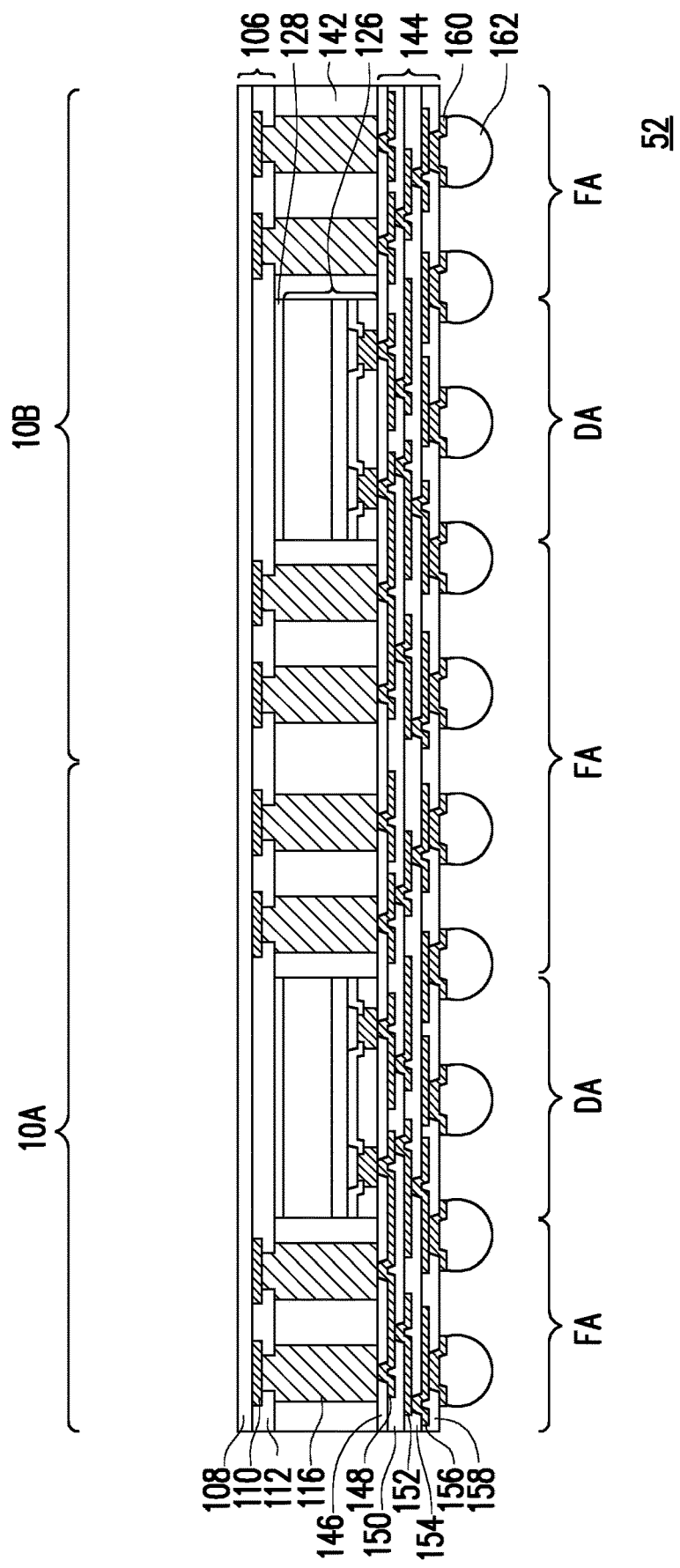
Figure 8:
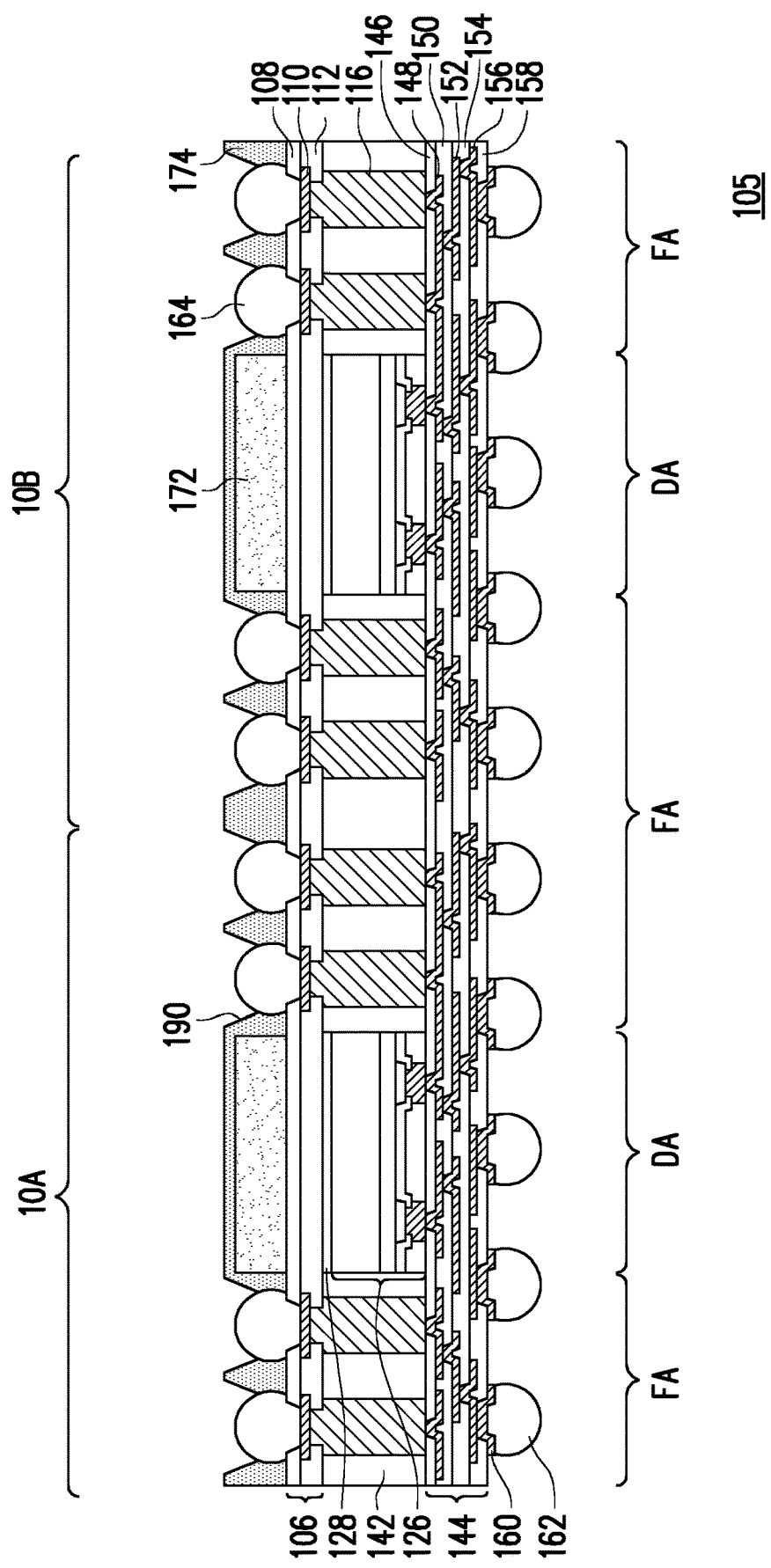
FIG. 8 is schematic cross-sectional view illustrating a device package according to some embodiments of the disclosure.

Referring to FIG. 7B, after an encapsulant 142, a front-side redistribution structure 144, UBMs 160 and conductive connectors 162 are formed, a carrier substrate de-bonding is performed to detach (or "de-bond") the carrier substrate 102 from the back-side redistribution structure 106, e.g., the dielectric layer 108 to form a device package 52. The device package 52 is then flipped over and placed on a tape (not shown).

Figure 7C:
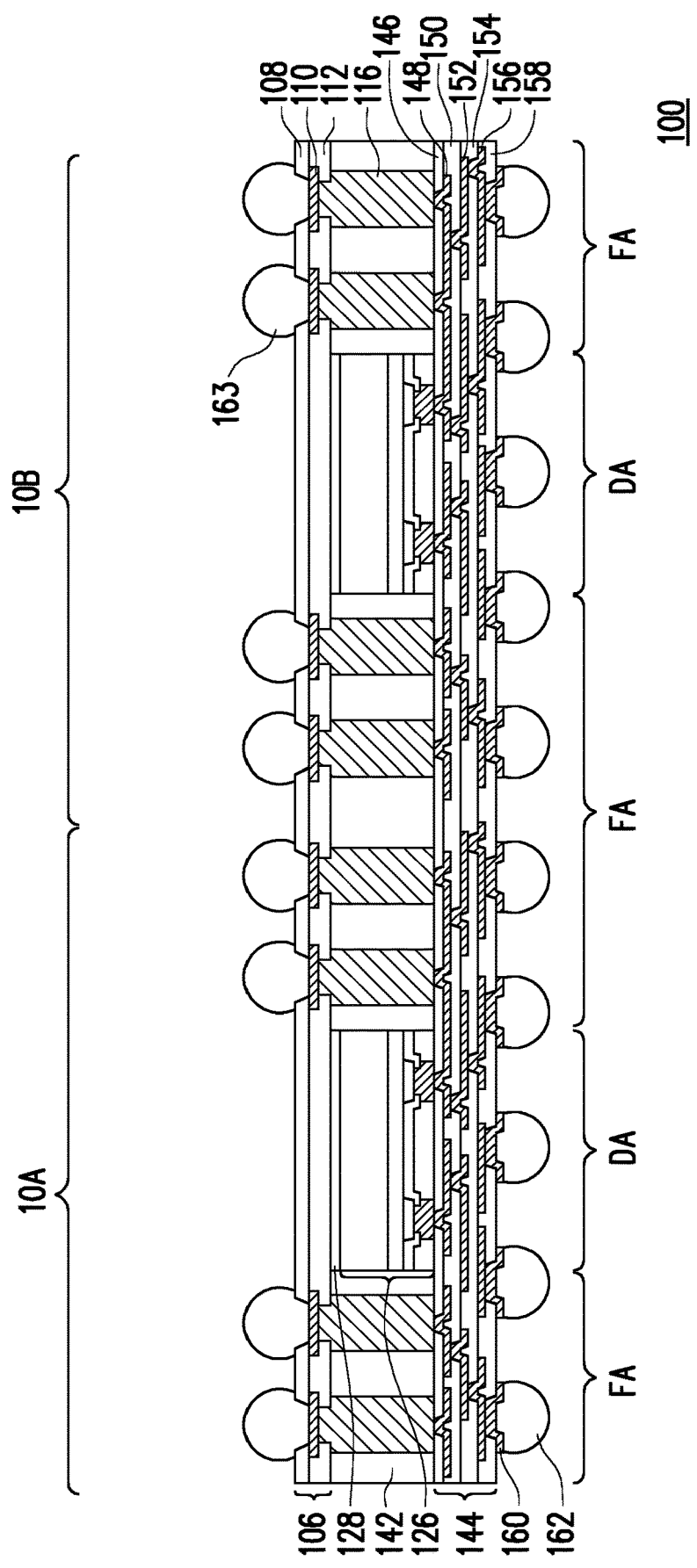

Referring to FIG. 7C, openings (not shown) are formed through the bottom dielectric layer 108 to expose portions of the metallization pattern 110. The openings may be formed, for example, using laser drilling, laser trimming, etching, or the like. Conductive pastes 163 are formed extending through the bottom dielectric layer 108 to contact the metallization pattern 110.

Figure 7D:
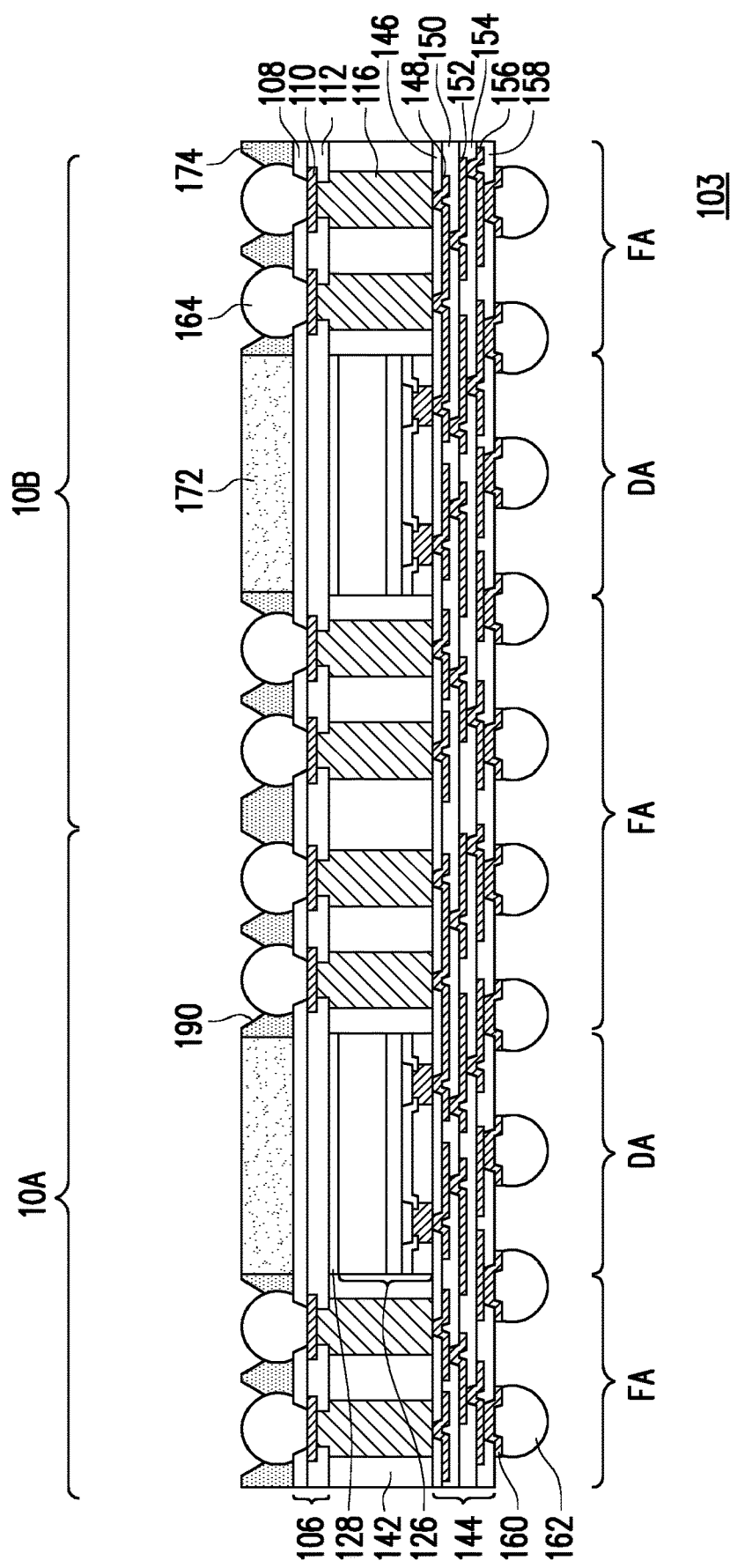

Referring to FIGS. 7D and 8, a warpage control material 172 is formed on the dielectric layer 108 in a designed region such as die areas DA. After a reflow process is performed, a protection material 174 is formed on fan-out areas FA (shown in 7D) or further formed on the warpage control material 172 in the die areas DA (shown in 8). The protection material 174 is cured, and openings 190 are formed through the protection material 174 to expose the top surfaces of the conductive connectors 164. At this stage, device packages 103 and 105 are substantially completed.

Referring to FIGS. 7D and 8, the warpage control material 172 is formed on and in contact with the surface of the bottom dielectric layer 108 in the designed region such as the die areas DA. The back-side redistribution structure 106 and the adhesive 128 separate the warpage control material 172 and the integrated circuit dies 126.

Referring to FIG. 7D, in the device package 103, bottom surface of the protection material 174 and bottom surface of the warpage control material 172 are coplanar. The remaining protection material 174 covers and is in contact with the top surfaces of the conductive connectors 164, the top surface of the bottom dielectric layer 108 in the fan-out area FA and sidewalls of the warpage control material 172 in the die areas DA. Further, the remaining protection material 174 separates the warpage control material 172 from the conductive connectors 164, and separates two adjacent conductive connectors 164.

Referring to FIG. 8, in the device package 105, bottom surface of the protection material 174 and bottom surface of the warpage control material 172 are coplanar. The protection material 174 covers and is in contact with the top surfaces of the conductive connectors 164, the top surface of the bottom dielectric layer 108 in the fan-out area FA and sidewalls of the warpage control material 172 in the die areas DA, and further covers and is in contact with the top surface of the warpage control material 172 in the die areas DA.

FIGS. 9A through 9D are schematic cross-sectional views illustrating a method of manufacturing a device package according to some embodiments of the disclosure. FIG. 10 is schematic cross-sectional view illustrating a device package according to some embodiments of the disclosure.

Referring to FIG. 9A, in alternative embodiments, a carrier substrate 102 is provided, and a release layer 104 is formed on the carrier substrate 102. Before conductive pillars 116 are formed, a bottom dielectric layer 108 is formed on the release layer 104.

Figure 9B:
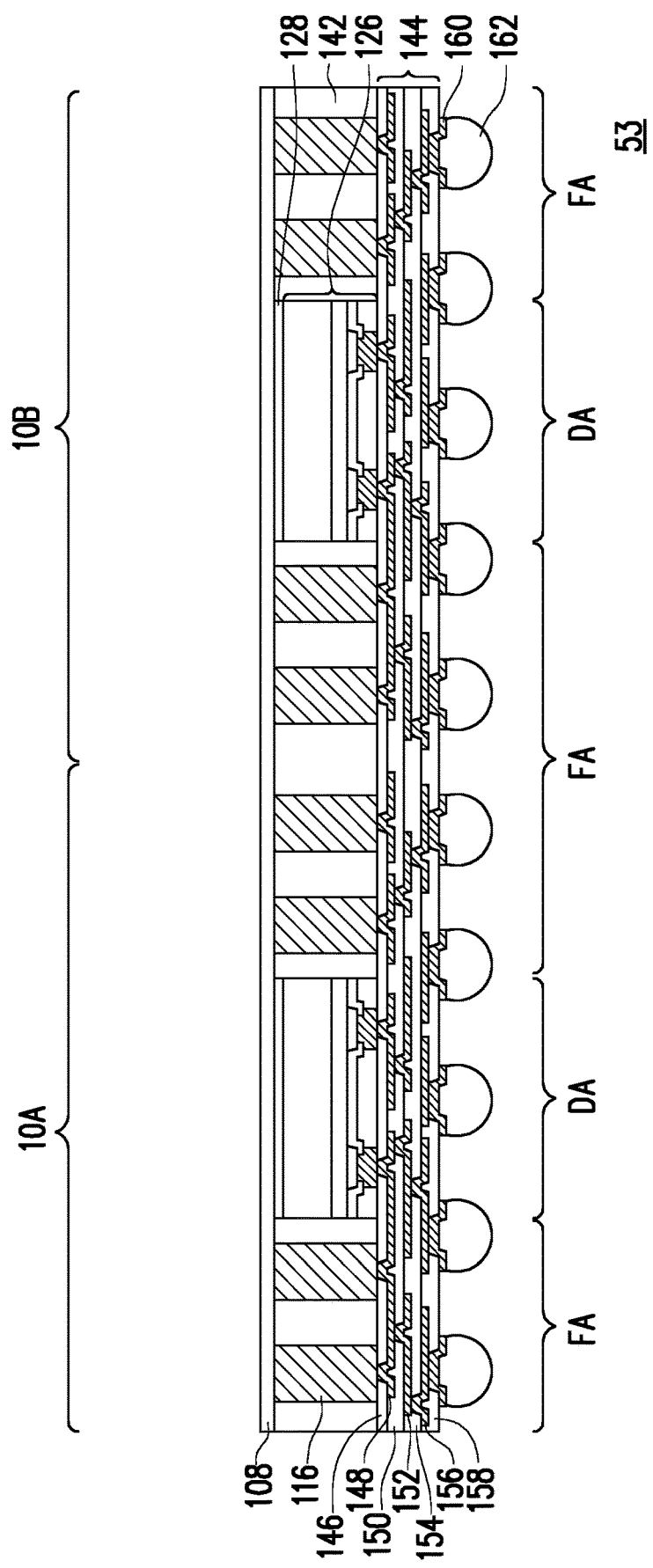
Figure 10:
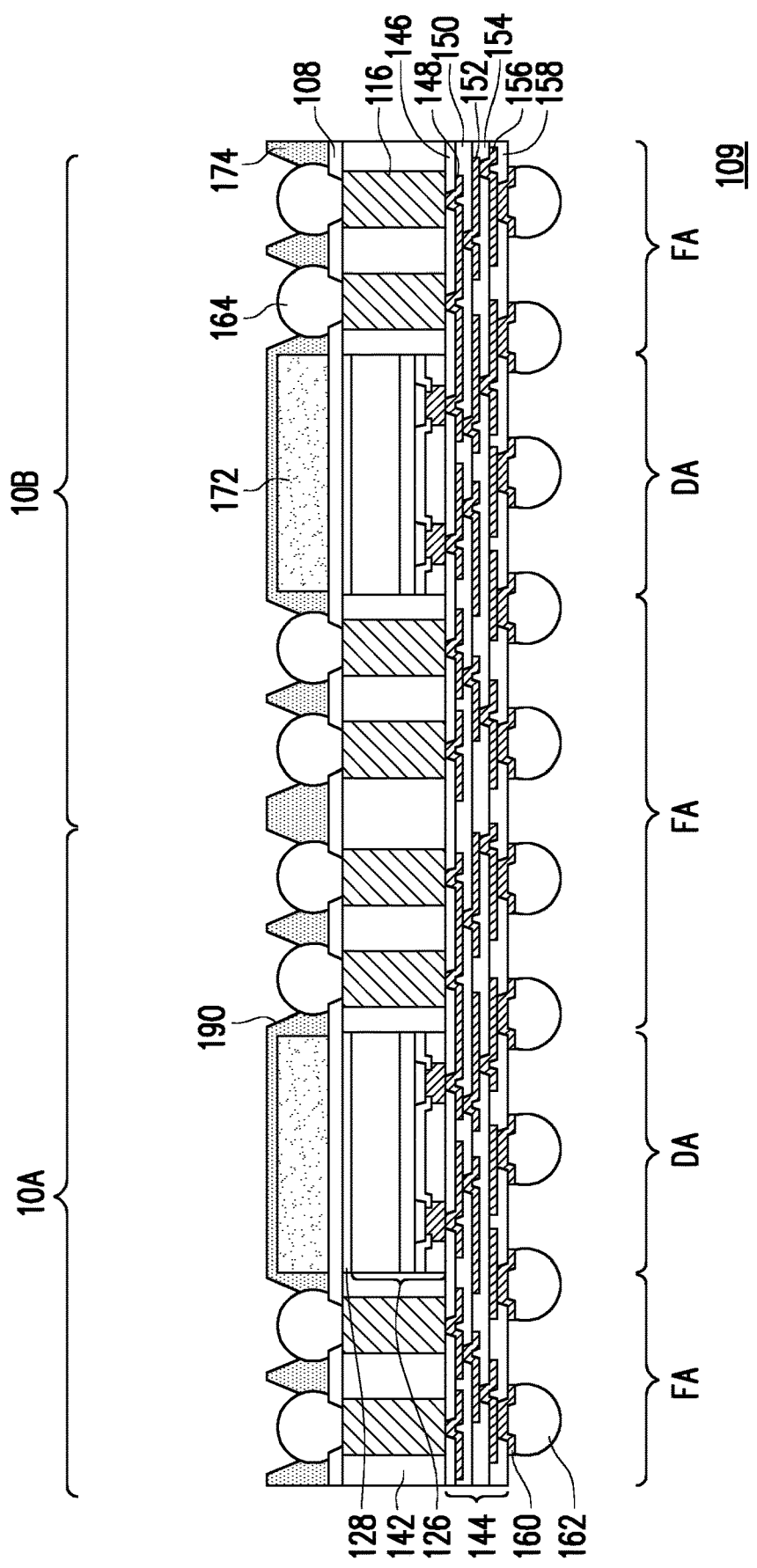
FIG. 10 is schematic cross-sectional view illustrating a device package according to some embodiments of the disclosure.

Referring to FIG. 9B, after an encapsulant 142, a front-side redistribution structure 144, UBMs 160 and conductive connectors 162 are formed, a carrier substrate de-bonding is performed to detach (or "de-bond") the carrier substrate 102 from the dielectric layer 108 to form a device package 53. The device package 53 is then flipped over and placed on a tape (not shown).

Figure 9C:
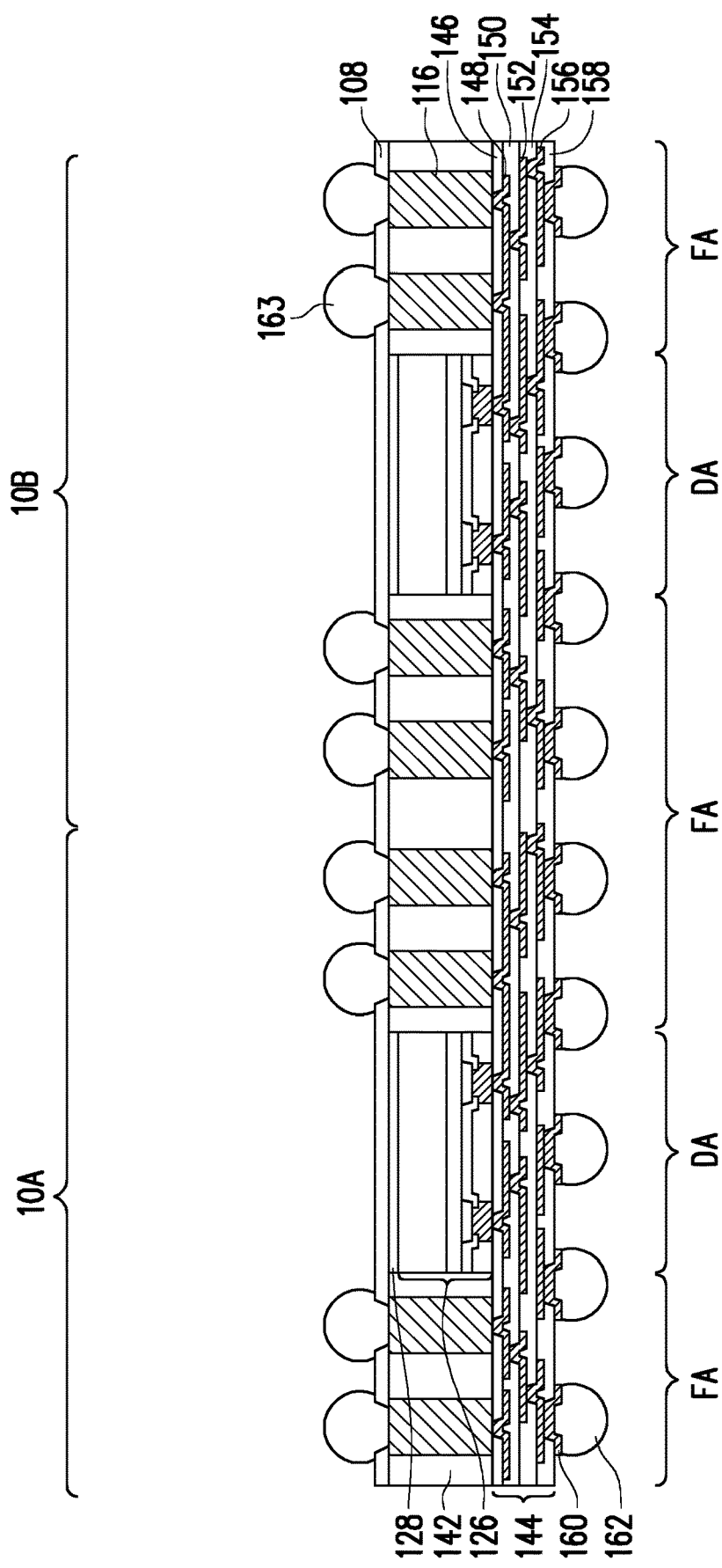

Referring to FIG. 9C, openings (not shown) are formed through the bottom dielectric layer 108 to expose portions of the conductive pillars 116. The openings may be formed, for example, using laser drilling, laser trimming, etching, or the like. Conductive pastes 163 are formed extending through the bottom dielectric layer 108 to contact the conductive pillars 116.

Figure 9D:
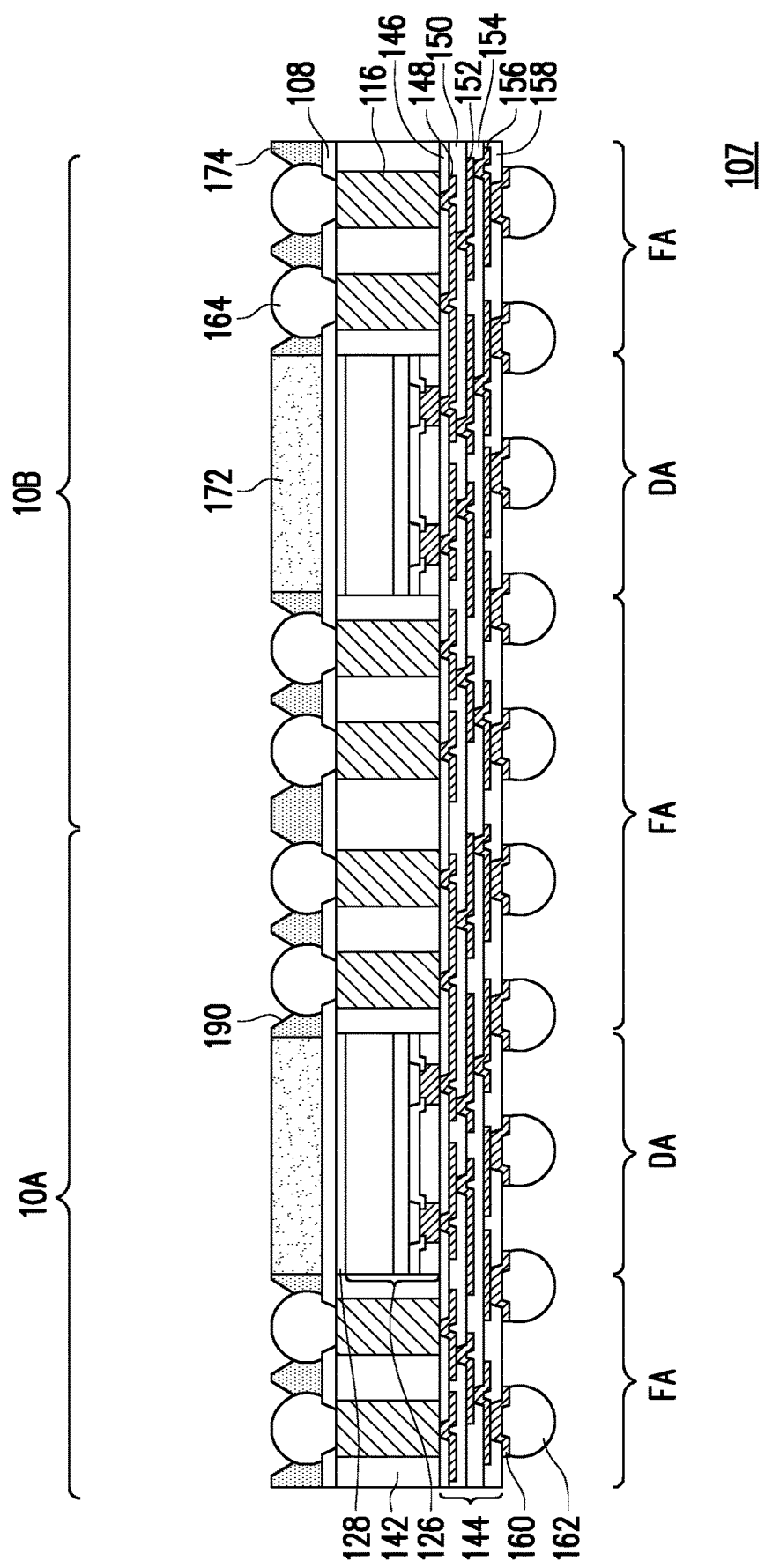

Referring to FIGS. 9D and 10, a warpage control material 172 is formed on a designed region such as die areas DA. After a reflow process is performed, a protection material 174 is formed in fan-out areas FA (as shown in FIG. 9D) or further formed on the warpage control material 172 in die areas DA (as shown in FIG. 10). The protection material 174 is cured, and openings 190 are formed through the protection material 174 to expose the top surfaces of the conductive connectors 164. At this stage, device packages 107 and 109 are substantially completed.

Referring to FIGS. 9D and 10, the warpage control material 172 is formed on and in contact with the surface of the bottom dielectric layer 108 in the designed region such as the die areas DA. The bottom dielectric layer 108 and the adhesive 128 separate the warpage control material 172 and the integrated circuit dies 126.

Referring to FIG. 9D, in the device package 107, bottom surface of the protection material 174 and bottom surface of the warpage control material 172 are coplanar. The remaining protection material 174 covers and is in contact with the top surfaces of the conductive connectors 164, the top surface of the bottom dielectric layer 108 in the fan-out area FA and sidewalls of the warpage control material 172 in the die areas DA. Further, the remaining protection material 174 separates the warpage control material 172 from the conductive connectors 164, and separates two adjacent conductive connectors 164.

Referring to FIG. 10, in the device package 109, bottom surface of the protection material 174 and bottom surface of the warpage control material 172 are coplanar. The protection material 174 covers and is in contact with top surfaces of the conductive connectors 164, the top surface of the bottom dielectric layer 108 in the fan-out area FA and sidewalls of the warpage control material 172 in the die areas DA, and further covers and is in contact with the top surface of the warpage control material 172 in the die areas DA.

FIG. 11 is a schematic cross-sectional view illustrating package structures 50A' and 100A' according to alternative embodiments of the disclosure. FIG. 16 is a schematic cross-sectional view illustrating package structures 50A' and 101A' according to some embodiments of the disclosure.

Referring to FIGS. 11 and 16, a package structure 50A' is a portion of the device package 50 (shown in FIG. 1E). A structure of the package structure 50A' is similar to a structure of the package structure 50A (shown in FIGS. 2 and 6), and the difference is that the package structure 50A' has the "M" shape. In some embodiments, the topmost surface of the package structure 50A' is located in an interface between a die area DA and a fan-out area FA, or in the die area DA adjacent to the interface, or in the fan-out area FA adjacent to the interface.

FIGS. 12A through 12C, and 14A through 14B are schematic cross-sectional views illustrating methods of manufacturing device packages 100' and 101' according to alternative embodiments of the disclosure. FIGS. 13A through 13B and 15A through 15B are schematic top views illustrating methods of manufacturing device packages 100' and 101' according to other some embodiments of the disclosure. FIGS. 17, 18, 19 and 20 are schematic cross-sectional views illustrating device packages 103', 105', 107' and 109' according to some embodiments of the disclosure. The methods of manufacturing the device packages 100', 101', 103', 105', 107', and 109' are similar to the methods manufacturing the device packages 100, 101, 103, 105, 107, and 109, and differ in that warpage control materials 172 and protection materials 174 are disposed at different positions.

In some embodiments, the warpage control material 172 is disposed in the interfaces between the die areas DA and the fan-out areas FA as shown in FIGS. 12A, 14A, 17, 18, 19 and 20. The warpage control material 172 is disposed to partially cover the adhesive 128, which is disposed on the integrated circuit dies 126, in the die areas DA, and the encapsulate 142 in the fan-out areas FA, and exposes a portion of the adhesive 128 in the die areas DA and a portion of the encapsulate 142 in the fan-out areas FA. In some embodiments, the warpage control material 172 may be spaced apart from conductive pastes 163. The warpage control material 172 may has, for example, a ring shape from a top view as shown in FIGS. 13A, 13B, 15A and 15B.

Figure 12A:
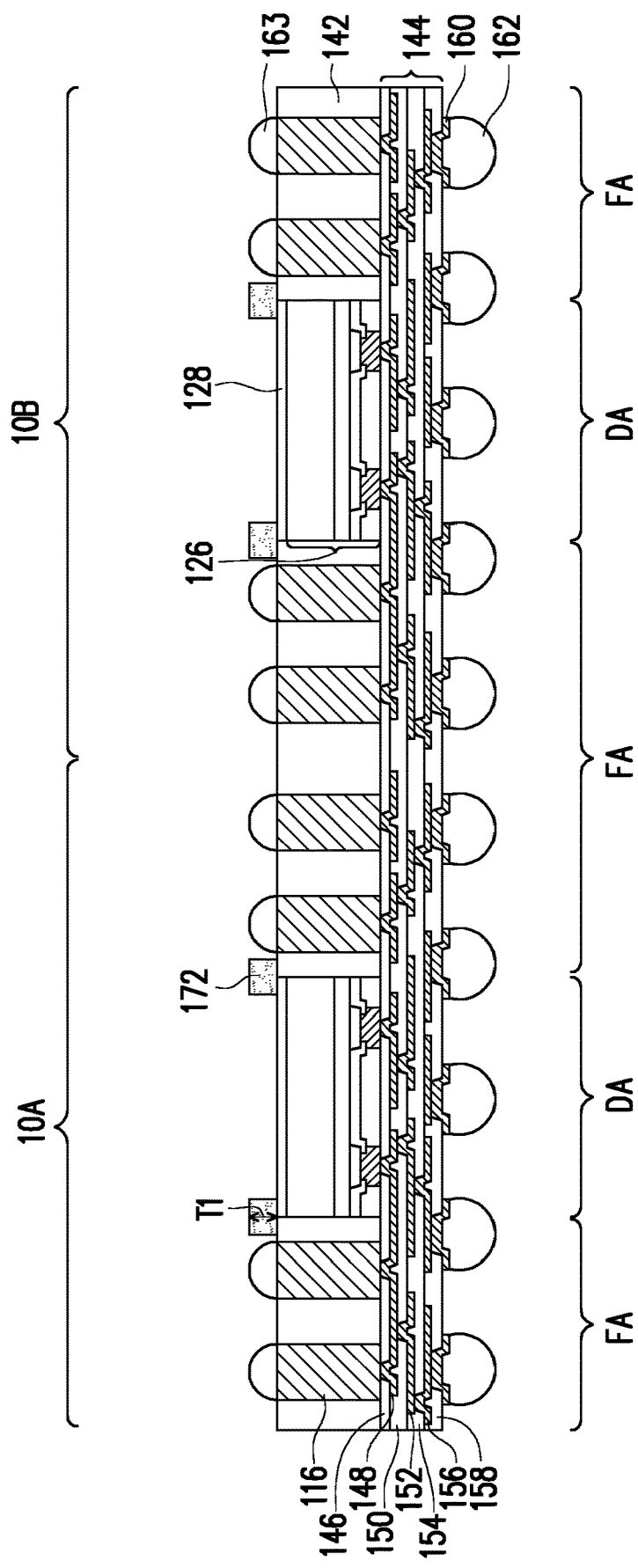
FIGS. 12A through 12C, and 14A through 14B are schematic cross-sectional views illustrating methods of manufacturing device packages according to alternative embodiments of the disclosure.
Figure 12B:
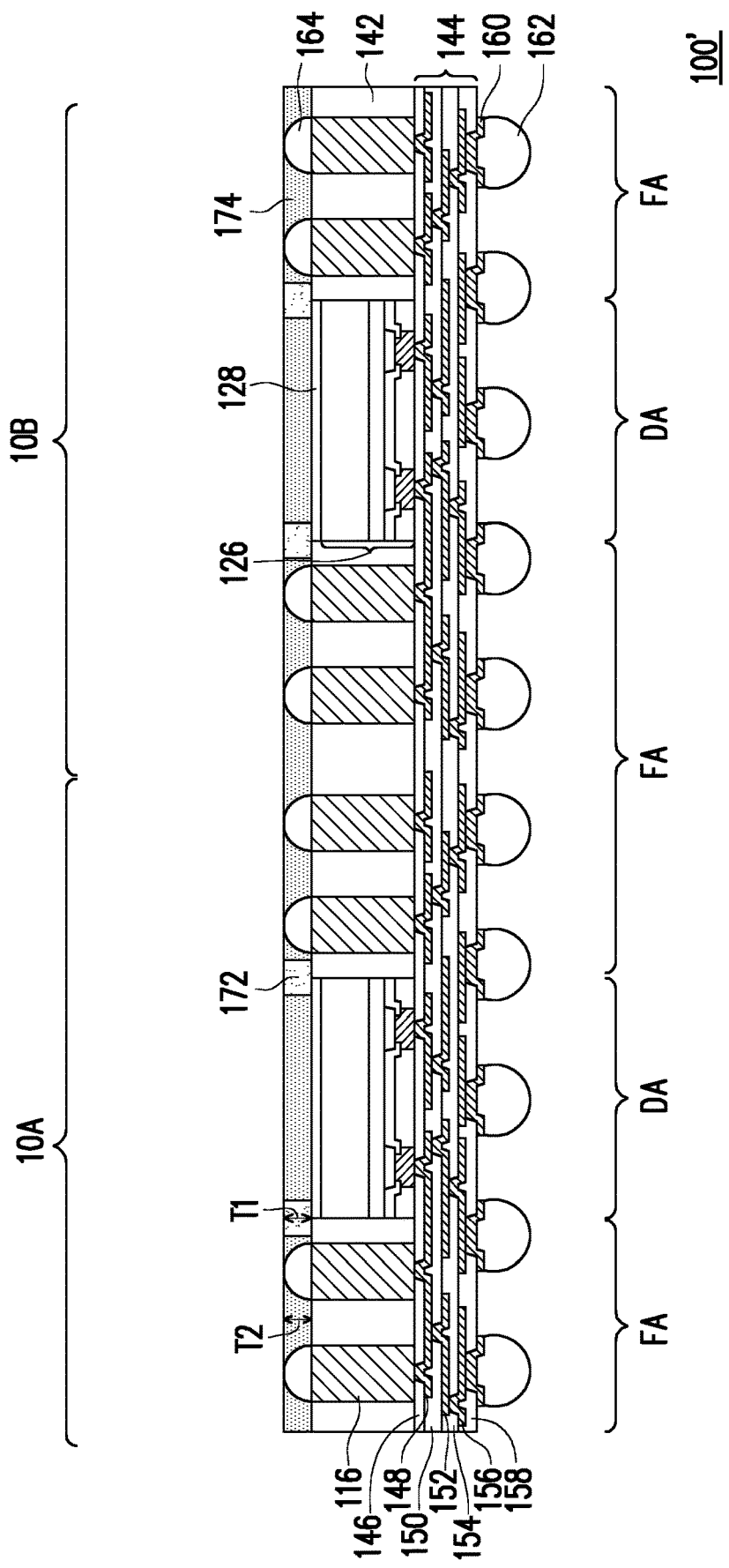
Figure 12C:
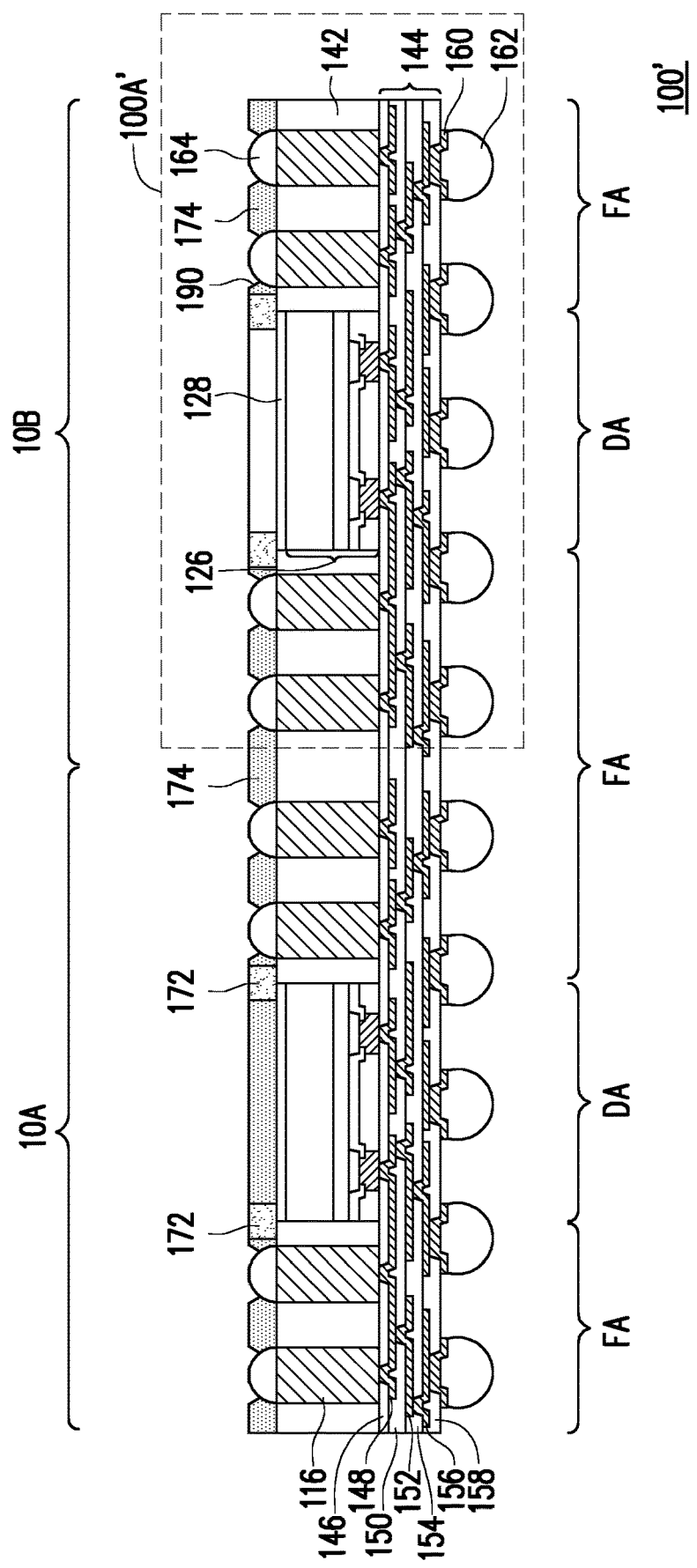
Figure 13A:
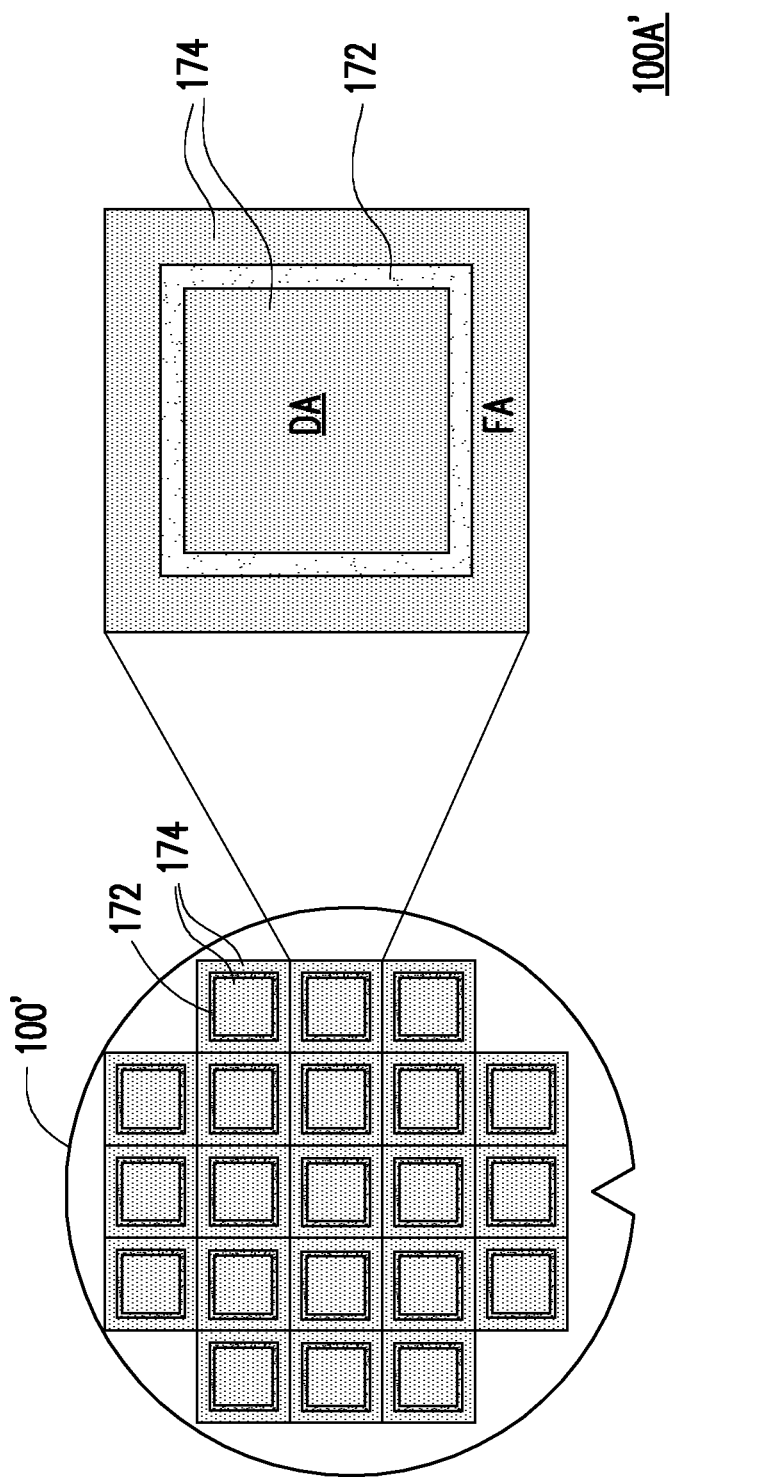
FIGS. 13A through 13B, and 15A through 15B are schematic top views illustrating methods of manufacturing device packages according to other some embodiments of the disclosure.
Figure 13B:
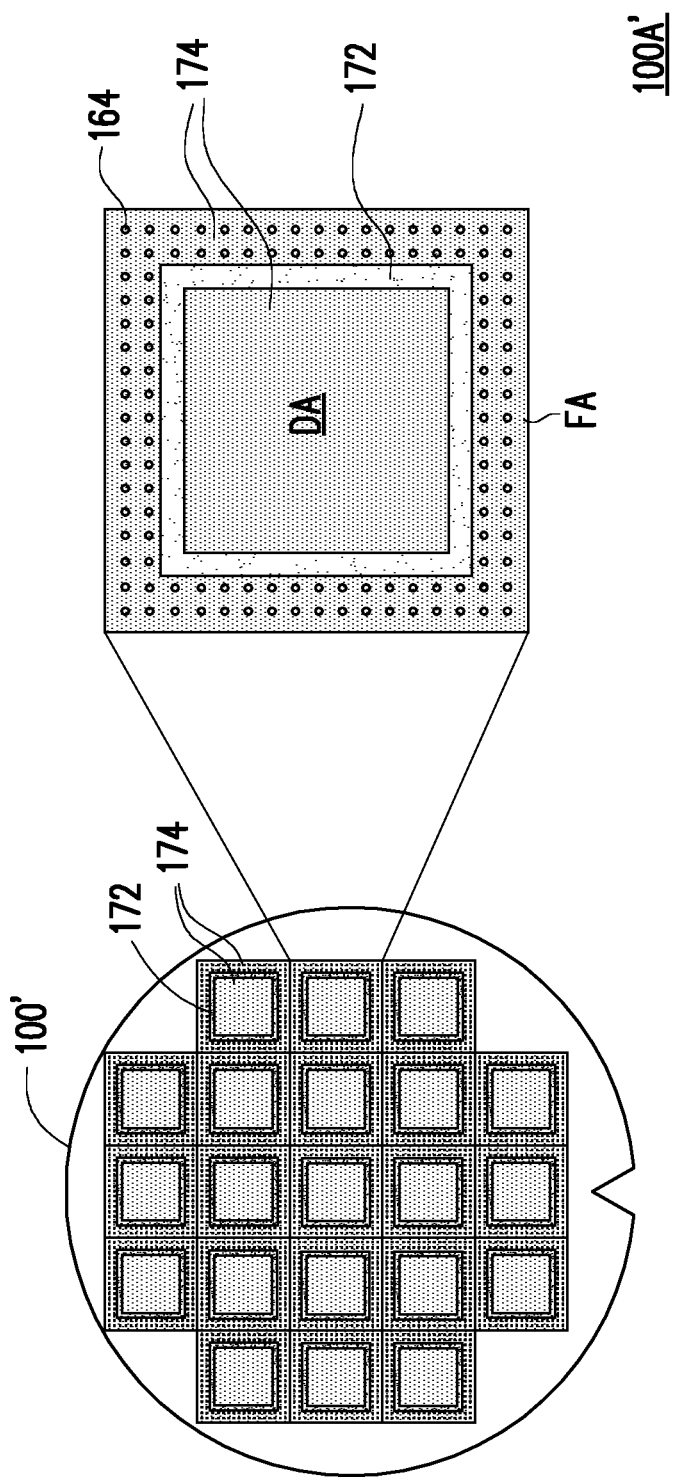
Figure 14A:
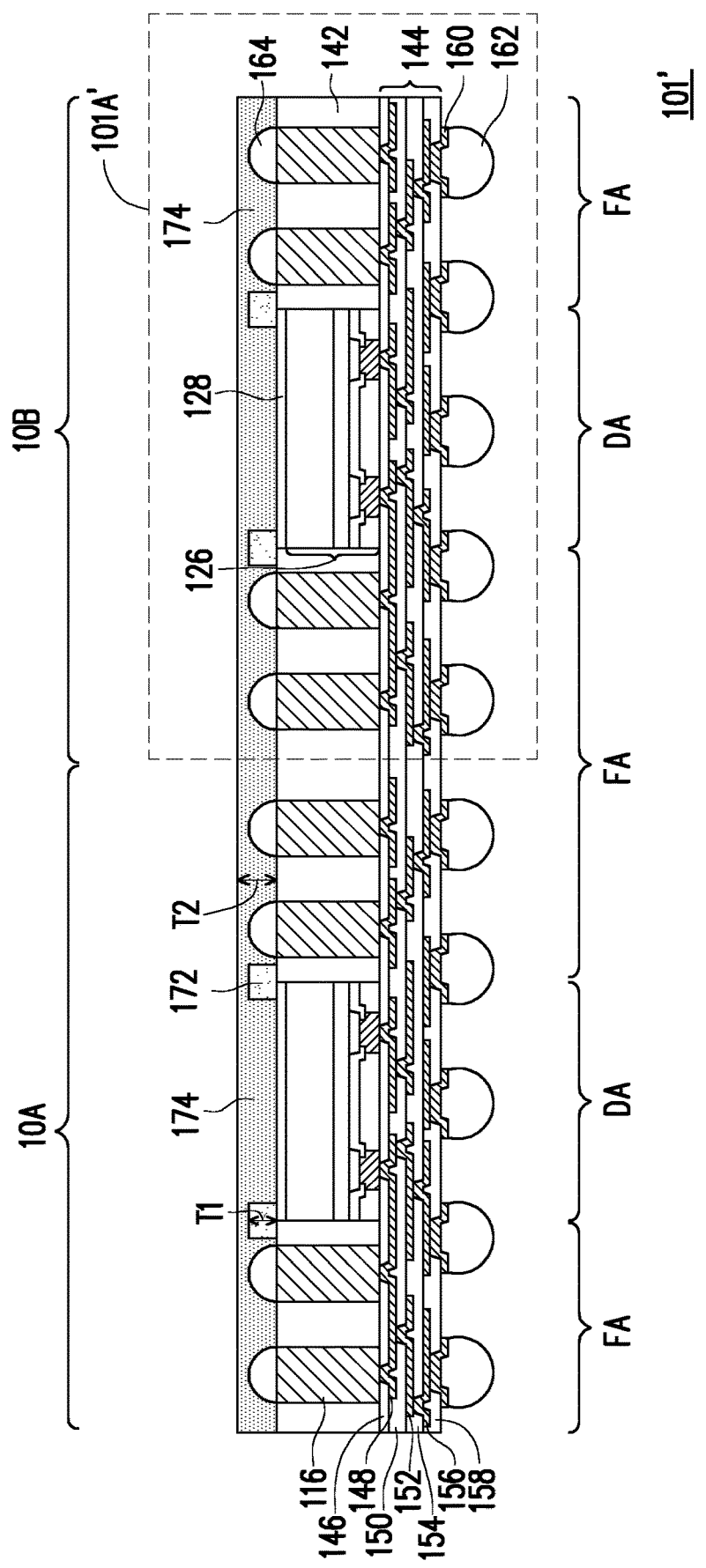
Figure 14B:
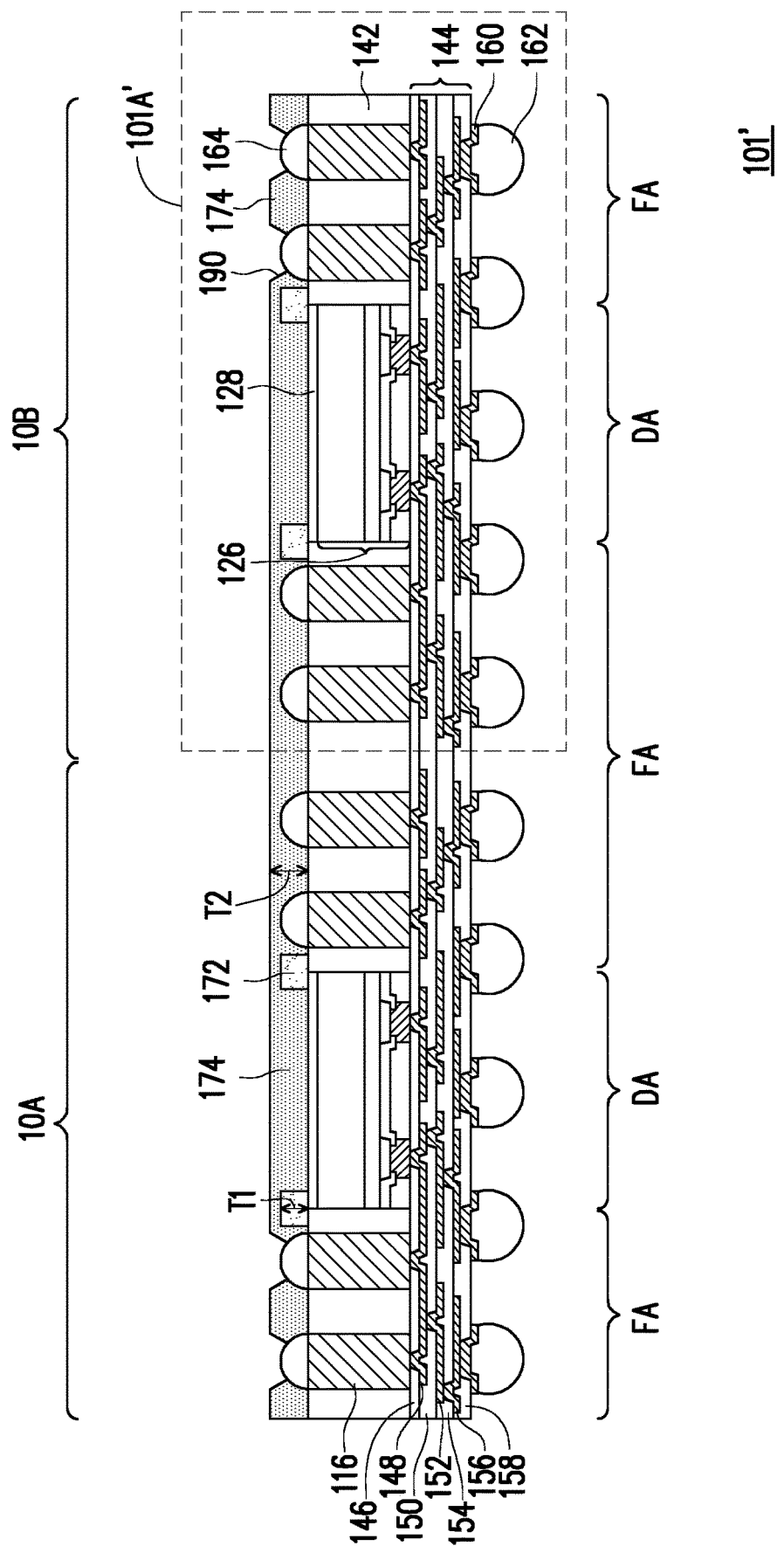
Figure 15A:
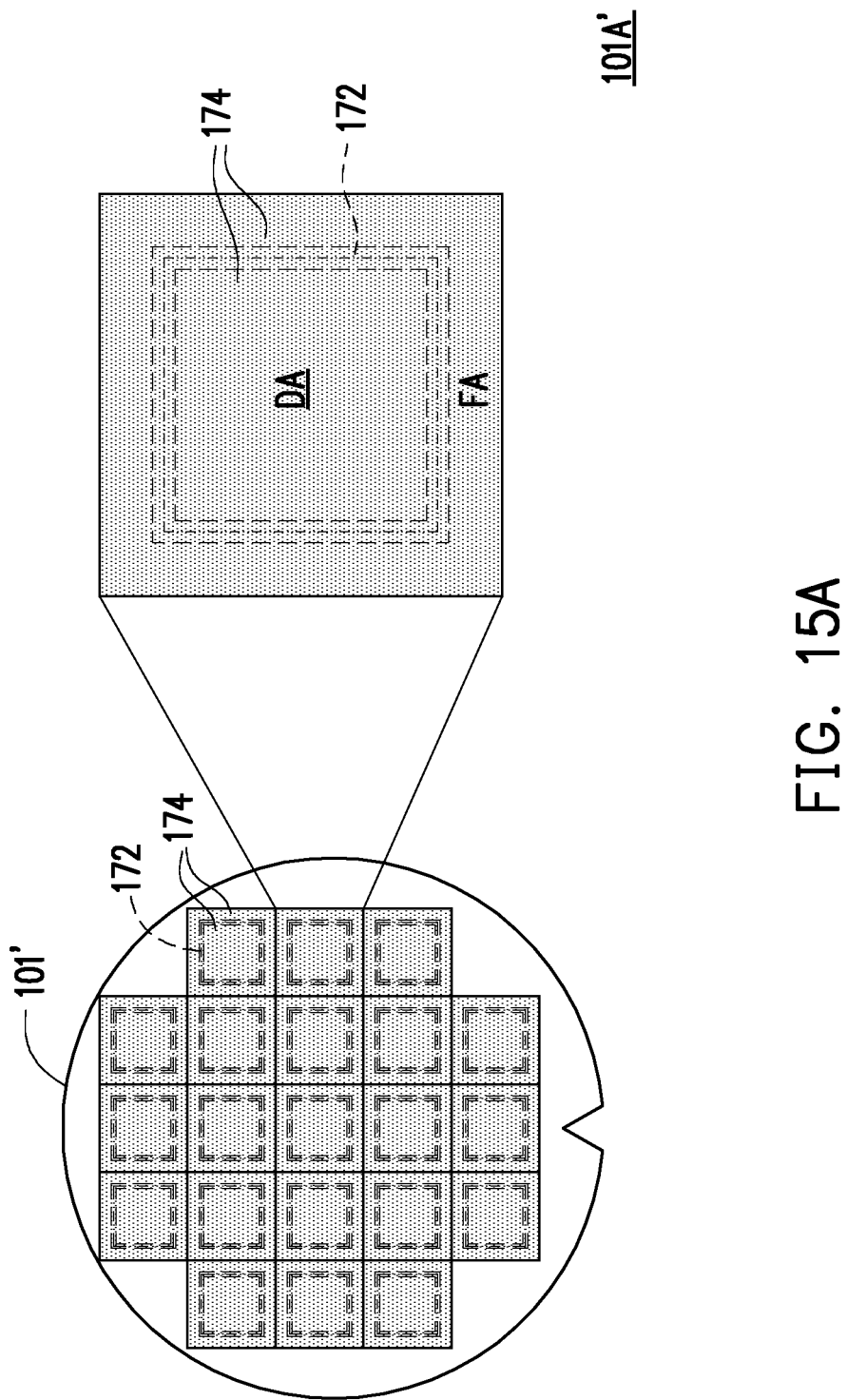
Figure 15B:
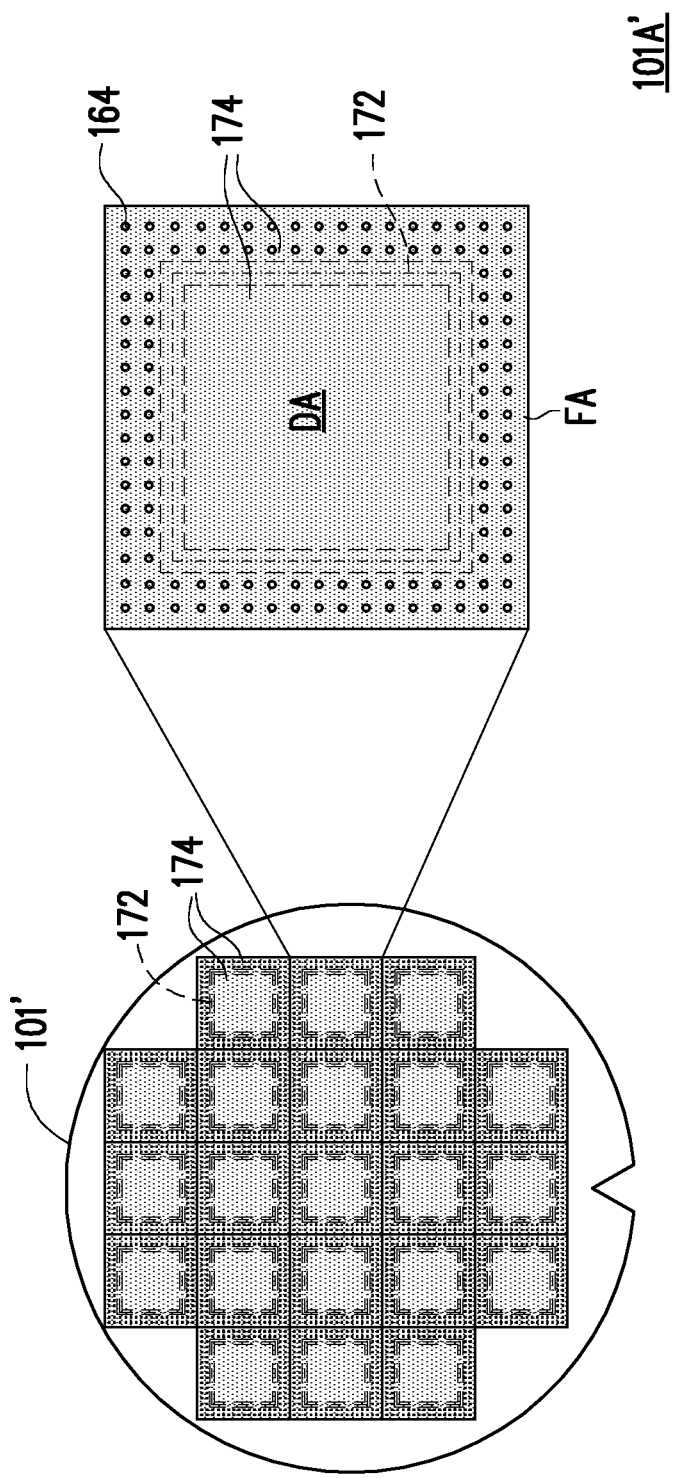

The protection material 174 is at least disposed on the portion of the die areas DA and the portion of the fan-out areas FA, where is not covered by the warpage control material 172, as shown in FIGS. 12B, 12C, 14A, 14B, 17, 18, 19 and 20. The protection material 174 is in contact with portion surfaces of the conductive connectors 164, a top surface of the encapsulate 142 in the fan-out areas FA, and sidewalls of the warpage control material 172. The protection material 174 is further in contact with an adhesive 128 in the die area DA (as shown in FIGS. 12B and 14B), or a bottom dielectric layer 108 (as shown in FIGS. 17 to 20). The warpage control material 172 and the conductive connectors 164 are separated by the protection material 174.

Bottom surface of the protection material 174 and bottom surface of the warpage control material 172 may be coplanar as shown in FIGS. 11, 12C, 14B, 16, 17, 18, 19 and 20. In some embodiments, top surfaces of the protection material 174 and top surfaces the warpage control material 172 may be coplanar as shown in FIGS. 11, 12C, 17, and 19. In alternative embodiments, the top surfaces the warpage control material 172 is cover by the protection material 174 as shown in FIGS. 14B, 16, 18, and 20. Openings 190 are formed through the protection material 174 to expose the top surfaces of the conductive connectors 164 as shown in FIGS. 12C, 13B, 14B, 15B, 18, 19, and 20.

Referring to FIGS. 11 and 16, after the warpage control material 172 and the protection material 174 are formed, the warpages of the package structure 100A' of the device package 100' and the package structure 101A' of the device package 101' are reduced. The warpages of the package structures of the device packages 103', 105', 107' and 109' may also be reduced (not shown).

In the embodiments of the disclosure, the warpage control material is formed on the design area such as the die areas or the interfaces between the die areas and the fan-out areas to reduce the CTE mismatch and thus avoiding or reducing warpage. The protection material at least covers and protects the surfaces of the fan-out areas and thus avoiding or reducing damage.

In accordance with some embodiments of the disclosure, a package structure, includes a die, a plurality of through vias, a plurality of first connectors, a warpage control material and a protection material. The plurality of through vias are disposed around the die. The encapsulant laterally encapsulates the die and the plurality of through vias. The plurality of first connectors are electrically connected to the plurality of through vias. The warpage control material is disposed over a first surface of the die. The protection material is disposed over a first surface of the encapsulant, around the plurality of first connectors and the warpage control material.

In accordance with alternative embodiments of the disclosure, a package structure, includes a die, a plurality of through vias, a plurality of first connectors, a warpage control material and a protection material. The plurality of through vias are disposed around the die. The encapsulant laterally encapsulates the die and the plurality of through vias. The plurality of first connectors are electrically connected to the plurality of through vias. The warpage control material is disposed over a first surface of the die. The protection material is disposed over a first surface of the encapsulant and a top surface of the warpage control material, around the plurality of first connectors and the warpage control material.

In accordance with some embodiments of the disclosure, a method of fabricating a package structure includes the following processes. A plurality of through vias are formed around a die. An encapsulant is formed a to laterally encapsulate the die and the plurality of through vias. A plurality of connectors are formed to electrically connect to the plurality of through vias. A warpage control material is formed over a first surface of the die. A protection material is formed over a first surface of the encapsulant, around the plurality of first connectors and the warpage control material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a die;
   a plurality of through vias, disposed around the die;
   an encapsulant, laterally encapsulating the die and the plurality of through vias;
   a plurality of first connectors, electrically connected to the plurality of through vias;
   a warpage control material, disposed over the die; and
   a protection material, disposed over the encapsulant, around the plurality of first connectors and the warpage control material,
   wherein a coefficient of thermal expansion of the protection material is less than a coefficient of thermal expansion of the encapsulant.

2. The package structure of claim 1, wherein the warpage control material is disposed to cover an entire surface of the die.

3. The package structure of claim 1, wherein the warpage control material is disposed to partially cover surfaces of the die and the encapsulant.

4. The package structure of claim 1, further comprising a dielectric layer disposed between the die and the warpage control material, and between the encapsulant and the protection material, wherein the plurality of first connectors extend through the dielectric layer to be in contact with the plurality of through vias.

5. The package structure of claim 1, wherein the warpage control material comprises a base material and a plurality of fillers in the base material.

6. The package structure of claim 1, wherein a Young's modulus of the warpage control material is greater than a Young's modulus of the encapsulant, and the Young's modulus of the encapsulant is greater than a Young's modulus of the protection material.

7. The package structure of claim 1, wherein the coefficient of thermal expansion of the encapsulant is less than a coefficient of thermal expansion of the warpage control material.

8. A package structure, comprising:
a die;
a plurality of through vias, disposed around the die;
an encapsulant, laterally encapsulating the die and the plurality of through vias;
a plurality of first connectors, electrically connected to the plurality of through vias;
a warpage control material, disposed over a first surface of the die; and
a protection material, disposed over a first surface of the encapsulant and a top surface of the warpage control material, around the plurality of first connectors and the warpage control material,
wherein a coefficient of thermal expansion of the protection material is less than a coefficient of thermal expansion of the encapsulant.

9. The package structure of claim 8, further comprising an adhesive disposed between the die and the warpage control material.

10. The package structure of claim 8, further comprising a dielectric layer disposed between the die and the warpage control material, and between the encapsulant and the protection material, wherein the plurality of first connectors extend through the dielectric layer to be in contact with the plurality of through vias.

11. The package structure of claim 8, further comprising:
a first redistribution structure disposed between the die and the warpage control material, and between the encapsulant and the protection material, wherein the plurality of first connectors and the plurality of through vias are in contact with a metallization pattern of the first redistribution structure;
a second redistribution structure disposed on a second surface of the die and a second surface of the encapsulant to electrically connect to the plurality of through vias; and
a plurality of second connectors to electrically connect to the second redistribution structure.

12. The package structure of claim 8, wherein the warpage control material comprises a base material and a plurality of fillers in the base material.

13. The package structure of claim 8, wherein a Young's modulus of the warpage control material is greater than a Young's modulus of the protection material.

14. The package structure of claim 8, wherein the coefficient of thermal expansion of the encapsulant is less than a coefficient of thermal expansion of the warpage control material.

15. A method of manufacturing a package structure, comprising:
forming a plurality of through vias around a die;
forming an encapsulant to laterally encapsulate the die and the plurality of through vias;
forming a plurality of connectors to electrically connect to the plurality of through vias;
forming a warpage control material over a first surface of the die; and
forming a protection material over a first surface of the encapsulant, around the plurality of first connectors and the warpage control material,
wherein a coefficient of thermal expansion of the protection material is less than a coefficient of thermal expansion of the encapsulant.

16. The method of claim 15, wherein the protection material is further formed over a top surface of the warpage control material.

17. The method of claim 15, wherein the warpage control material comprises a base material and a plurality of fillers in the base material.

18. The method of claim 15, wherein a Young's modulus of the warpage control material is greater than a Young's modulus of the protection material.

19. The method of claim 15, wherein the forming the plurality of first connectors comprises performing a reflow process after the forming the warpage control material.

20. The method of claim 15, further comprising:
performing a curing process after forming the protection material; and
forming openings in the protection material to expose the plurality of connectors.

* * * * *